US012701937B2

(12) United States Patent
Ko et al.

(10) Patent No.: US 12,701,937 B2
(45) Date of Patent: Aug. 4, 2026

(54) METHOD OF MANUFACTURING SEMICONDUCTOR DEVICE

(71) Applicant: Samsung Electronics Co., Ltd., Suwon-si (KR)

(72) Inventors: Eunhyea Ko, Suwon-si (KR); Daihyun Kim, Suwon-si (KR); Thanh Cuong Nguyen, Suwon-si (KR); Soyoung Lee, Suwon-si (KR); Jihyun Lee, Suwon-si (KR); Hoon Han, Suwon-si (KR); Byungkeun Hwang, Suwon-si (KR); Hiroyuki Uchiuzou, Tokyo (JP); Kiyoshi Murata, Tokyo (JP); Tomoharu Yoshino, Tokyo (JP); Younjoung Cho, Suwon-si (KR)

(73) Assignees: Samsung Electronics Co., Ltd., Gyeonggi-do (KR); Adeka Corporation, Tokyo (JP)

( * ) Notice: Subject to any disclaimer, the term of this patent is extended or adjusted under 35 U.S.C. 154(b) by 466 days.

(21) Appl. No.: 18/315,322

(22) Filed: May 10, 2023

(65) Prior Publication Data

US 2023/0369039 A1    Nov. 16, 2023

(30) Foreign Application Priority Data

May 12, 2022   (KR) ........................ 10-2022-0058597
Sep. 29, 2022   (KR) ........................ 10-2022-0124658

(51) Int. Cl.
*H10P 14/68*       (2026.01)
*H10P 14/60*       (2026.01)
*H10P 50/28*       (2026.01)

(52) U.S. Cl.
CPC ........ *H10P 14/687* (2026.01); *H10P 14/6508* (2026.01); *H10P 14/6514* (2026.01); *H10P 50/283* (2026.01); *H10P 50/287* (2026.01)

(58) Field of Classification Search
None
See application file for complete search history.

(56) References Cited

U.S. PATENT DOCUMENTS

| | | |
|---|---|---|
| 12,557,370 B2 * | 2/2026 | Ko ..................... H10D 30/6757 |
| 2018/0082942 A1 * | 3/2018 | Chawla .............. H01L 23/5226 |

(Continued)

FOREIGN PATENT DOCUMENTS

| | | |
|---|---|---|
| KR | 100219513 B1 | 9/1999 |
| KR | 10-2021-0029142 A | 3/2021 |

(Continued)

*Primary Examiner* — Erik Kielin
(74) *Attorney, Agent, or Firm* — Harness, Dickey & Pierce, P.L.C.

(57)        ABSTRACT

A method of manufacturing a semiconductor device is provided. The method includes providing a first layer having a first surface and a second layer having a second surface orthogonal to the first surface in a vertical direction, forming an inhibitor layer conformally on the first surface and the second surface, exposing the second surface by selectively removing the inhibitor layer on the second surface among the first surface and the second surface, the exposing of the second surface may include selectively removing an edge portion of the inhibitor layer on the first surface, the edge portion contacting the second surface, and forming an interest layer on the exposed second surface.

20 Claims, 35 Drawing Sheets

(56) References Cited

U.S. PATENT DOCUMENTS

| | | | |
|---|---|---|---|
| 2020/0105515 A1* | 4/2020 | Maes | ............... H01L 21/02068 |
| 2020/0347493 A1 | 11/2020 | Liu et al. | |
| 2021/0020444 A1 | 1/2021 | Tapily | |
| 2022/0017455 A1 | 1/2022 | Okawa et al. | |
| 2022/0081575 A1 | 3/2022 | Shinmen et al. | |
| 2022/0108917 A1 | 4/2022 | Shaviv et al. | |
| 2022/0130664 A1 | 4/2022 | Wang et al. | |
| 2022/0139772 A1 | 5/2022 | Jezewski et al. | |
| 2023/0142732 A1* | 5/2023 | Ko | ..................... H10D 30/6757 |
| | | | 438/154 |
| 2024/0014282 A1* | 1/2024 | Hu | ......................... H10D 30/43 |

FOREIGN PATENT DOCUMENTS

| | | | |
|---|---|---|---|
| KR | 102366555 B1 | 2/2022 | |
| WO | WO-2022-119865 A1 | 6/2022 | |

* cited by examiner (a)                                        (b)

(a)                    (b)

(a)                    (b)

(a)                                                    (b)

(a)                                         (b)

(a)          wet etch          (b)

(a)                                                                    (b)

METHOD OF MANUFACTURING SEMICONDUCTOR DEVICE

CROSS-REFERENCE TO RELATED APPLICATION

This application is based on and claims priority under 35 U.S.C. § 119 to Korean Patent Application Nos. 10-2022-0124658 and 10-2022-0058597, filed on Sep. 29, 2022 and May 12, 2022, in the Korean Intellectual Property Office, the disclosures of which are incorporated by reference herein in their entireties.

BACKGROUND

The inventive concepts relate to methods of manufacturing semiconductor devices, and more particularly, to methods of manufacturing semiconductor devices using selective desorption.

In accordance with the rapid development of the electronics industry and needs of users, electronic devices have been further made compact and lightweight. Accordingly, semiconductor devices having a high degree of integration are required to be used in electronic devices, and the design rules with respect to configurations of semiconductor devices have been reduced.

SUMMARY

The inventive concepts provide methods of manufacturing semiconductor devices with improved performance and reliability.

The problems to be solved by the inventive concepts are not limited to the problems mentioned above, and other problems not mentioned will be clearly understood by those skilled in the art from the description below.

According to some aspects of the inventive concepts, there is provided a method of manufacturing a semiconductor device. The method may include providing a first layer having a first surface and a second layer having a second surface orthogonal to the first surface in a vertical direction, forming an inhibitor layer conformally on the first surface and the second surface, exposing the second surface by selectively removing the inhibitor layer on the second surface among the first surface and the second surface, the exposing of the second surface may include selectively removing an edge portion of the inhibitor layer on the first surface, the edge portion contacting the second surface, and forming an interest layer on the exposed second surface.

According to some aspects of the inventive concepts, there is provided a method of manufacturing a semiconductor device. The method may include performing a pretreatment process on a first surface of a first layer, forming an inhibitor layer on the first surface and a second surface of a second layer, the first layer may include a metal nitride, and the second layer may not include a metal nitride, exposing the second surface by selectively removing the inhibitor layer on the second surface among the first surface and the second surface, and forming an interest layer on the exposed second surface.

According to some aspects of the inventive concepts, there is provided a method of manufacturing a semiconductor device. The method may include pretreating a first surface of a metal nitride layer with $H_2$ plasma, forming a first inhibitor layer on the first surface, forming a second inhibitor layer on a second surface of a gap-fill insulating layer orthogonal to the first surface in a vertical direction, exposing the second surface and a first portion of the first surface by selectively removing the second inhibitor layer from among the first inhibitor layer and the second inhibitor layer through a heat treatment process, and forming an interest layer on the second surface and the first portion of the first surface, and the first portion of the first surface may include a portion, on which a portion of the second inhibitor layer contacting the first surface and the second surface is formed.

BRIEF DESCRIPTION OF THE DRAWINGS

Example embodiments will be more clearly understood from the following detailed description taken in conjunction with the accompanying drawings in which.

DETAILED DESCRIPTION

Hereinafter, example embodiments of the inventive concepts will be described in detail with reference to the accompanying drawings.

Figure 1A:
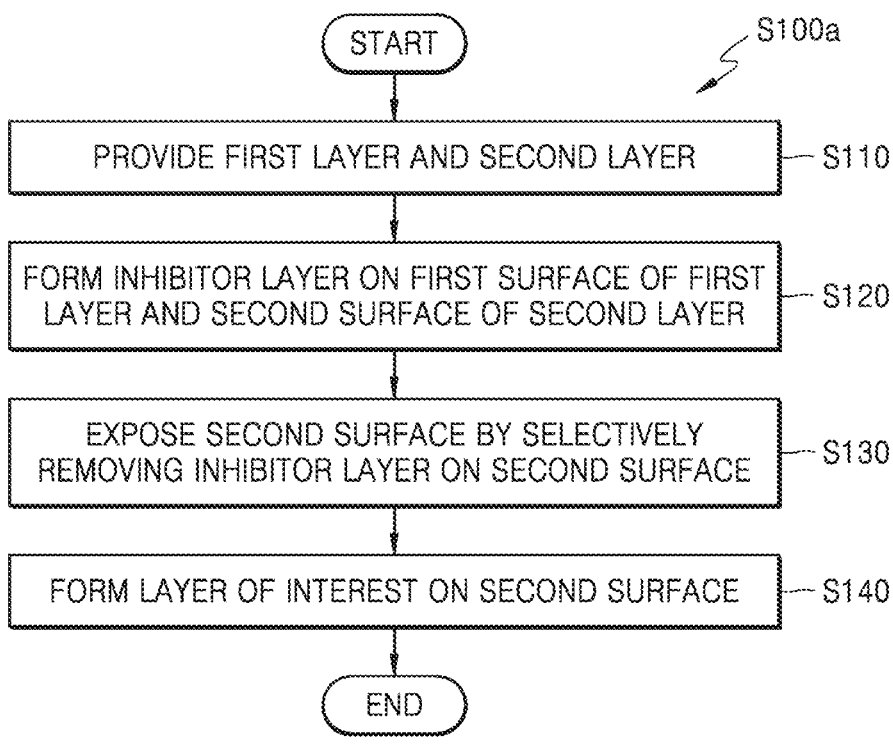
FIGS. 1A to 1C are flowcharts illustrating methods of manufacturing a semiconductor device, according to some example embodiments.
Figure 1B:
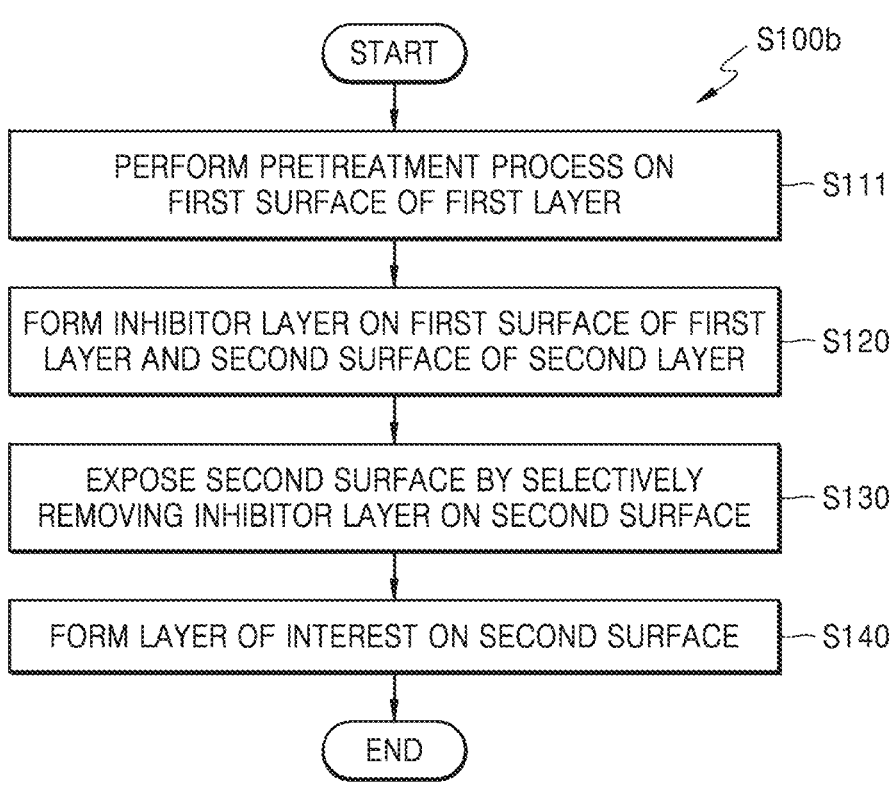
Figure 1C:
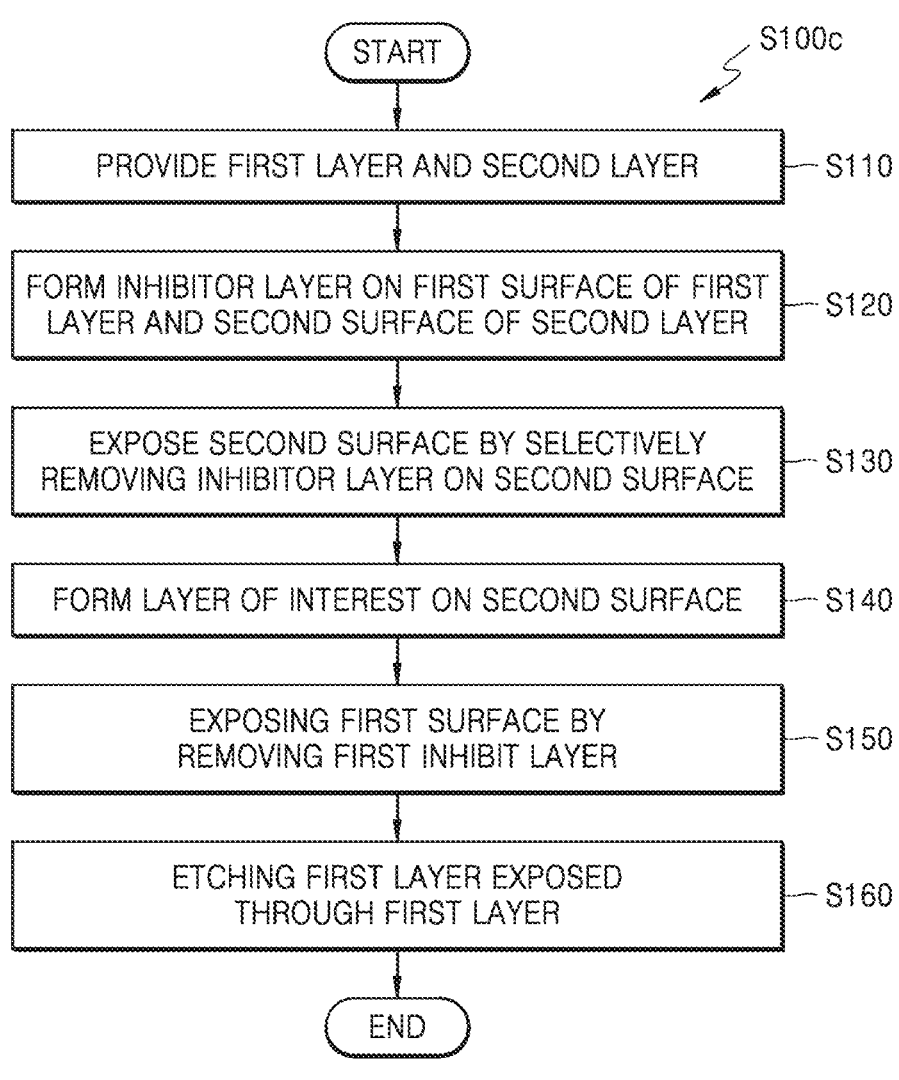

FIGS. 1A to 1C are flowcharts illustrating methods S100a, S100b, and S100c of manufacturing a semiconductor device, according to some example embodiments. FIGS. 2 to 8 are cross-sectional views illustrating methods S100a, S100b, and S100c of manufacturing the semiconductor device, according to some example embodiments.

Figure 2:
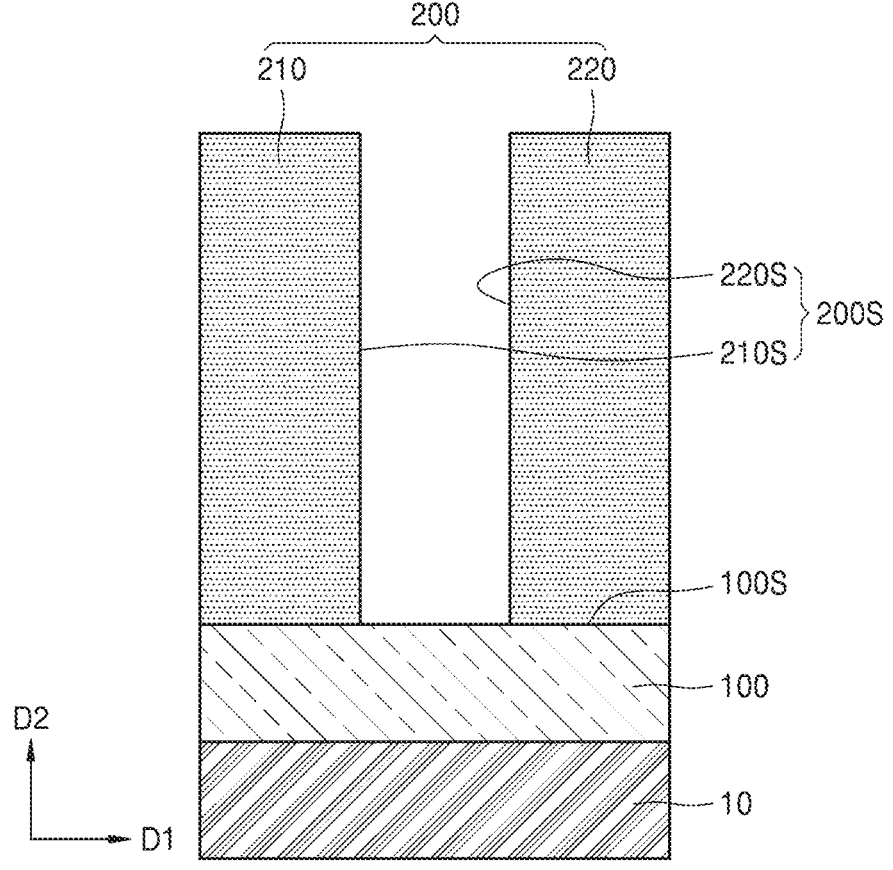
FIGS. 2 to 8 are cross-sectional views illustrating methods of manufacturing the semiconductor device, according to some example embodiments.

Referring to FIGS. 1A and 2, a first layer 100 and a second layer 200 may be provided (S110).

The first layer 100 may be a metal nitride layer formed on a substrate 10. That is, the first layer 100 may include, for example, titanium nitride (TiN) and/or titanium aluminum nitride (TiAlN). The second layer 200 may be a gap filling insulating film (GFIL). The second layer 200 may be, for example, a dry etch resistance layer, a wet etch resistance layer, or a photoresist layer, but is not limited thereto.

The second layer 200 is formed on a first surface 100S of the first layer 100. A part of the first surface 100S of the first layer 100 may be in contact with the second layer 200, and another part of the first surface 100S of the first layer 100 may be exposed by the second layer 200. For example, the second layer 200 may include a first sublayer 210 and a second sublayer 220. Although not shown, the first sublayer 210 and the second sublayer 220 may be formed by etching the second layer 200 in a vertical direction D2. The first sublayer 210 may be a first gap-fill insulating pattern, and the second sublayer 220 may be a second gap-fill insulating pattern.

The first sublayer 210 and the second sublayer 220 may be spaced apart from each other in the horizontal direction D1. As the first sublayer 210 and the second sublayer 220 are spaced apart from each other, the first surface 100S of the first layer 100 may be exposed. The first sublayer 210 includes a second surface 210S. The second surface 210S of the first sublayer 210 may face the second sublayer 220. The second sublayer 220 includes a second surface 220S. The second surface 220S of the second sublayer 220 may face the first sublayer 210. That is, the second surface 210S of the first sublayer 210 and the second surface 220S of the second sublayer 220 may face each other.

That is, the first surface 100S may extend in the horizontal direction D1, and the second surface 200S may extend in the vertical direction D2. The first surface 100S and the second surface 200S may be orthogonal to each other in the vertical direction D2.

The second layer 200 may include an acid-precursor. That is, when a stimulus such as heat, light, or electromagnetic waves is applied to the second layer 200, the second layer 200 may release acid or hydrogen cations. The second layer 200 may release a material including acid or hydrogen cations.

Figure 3:
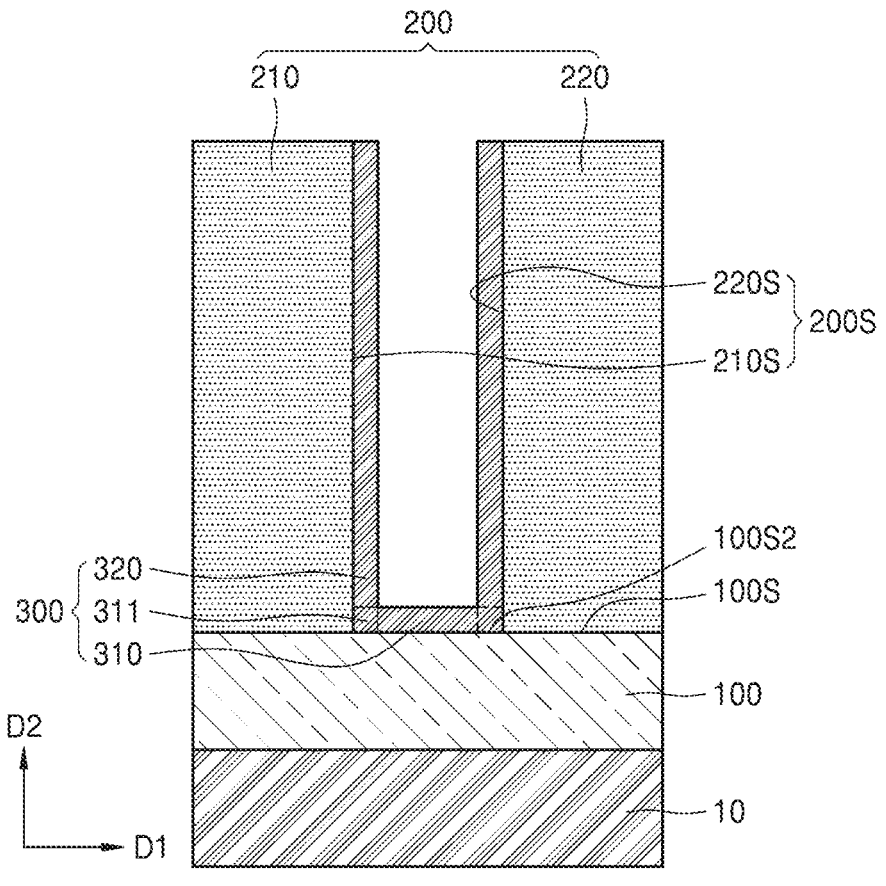

Referring to FIGS. 1A and 3, an inhibitor layer 300 may be formed on the first surface 100S of the first layer 100 and the second surface 200S of the second layer 200 (S120).

The inhibitor layer 300 may be conformally formed on the first surface 100S of the first layer 100 and the second surface 200S of the second layer 200, but is not limited thereto. Forming the inhibitor layer 300 may be performed under the condition of a temperature equal to or higher than exactly or about 80° C. and equal to or lower than exactly or about 240° C. Forming the inhibitor layer 300 may take from a minimum of exactly or about 1 minute to a maximum of exactly or about 20 minutes. However, the inventive concepts are not limited thereto, and the temperature and time used to form the inhibitor layer 300 may vary depending on process conditions and circumstances.

The inhibitor layer 300 may include a first inhibitor layer 310 and a second inhibitor layer 320. The first inhibitor layer 310 may be formed on the first surface 100S. The first inhibitor layer 310 may extend in the horizontal direction D1 along the first surface 100S. The second inhibitor layer 320 may be formed on the second surface 200S. The second inhibitor layer 320 may extend in the vertical direction D2 along the second surface 200S.

In some example embodiments, the inhibitor layer 300 may include a first portion 311. The first portion 311 may be a portion that simultaneously contacts the first surface 100S and the second surface 200S at a point where the first surface 100S intersects with the second surface 200S. For example, the first portion 311 may include an edge portion of the inhibitor layer 300 formed on the first surface 100S. In some example embodiments, the first portion 311 may be formed on a second portion 100S2 of the first surface 100S. That is, the inhibitor layer 300 may include the first inhibitor layer 310 contacting only the first surface 100S, the second inhibitor layer 320 contacting only the second surface 200S, and the first portion 311 contacting the first surface 100S and the second surface 200S. The first portion 311 may be a portion of the inhibitor layer 300 formed on the first surface 100S and adjacent to the second surface 200S. The first portion 311 may include a portion of the inhibitor layer 300 formed on the second surface 200S and adjacent to the first surface 100S.

In the example embodiments, a boundary line (indicated by a dashed line) between the first inhibitor layer 310 and the second inhibitor layer 320 of the first portion 311 is perpendicular to the first surface 100S and the second surface 200S, but this is only an example. In some example embodiments, the boundary line may form an angle with the first surface 100S and the second surface 200S rather than perpendicular thereto. In some example embodiments, the boundary line may be curved rather than straight. That is, the shape of the first portion 311 is a rectangle and is not limited to that shown, and may be any shape that simultaneously contacts the first surface 100S and the second surface 200S. Accordingly, the first inhibitor layer 310 and the second inhibitor layer 320 separated by the boundary line with the first portion 311 may also have various shapes that are not limited to those shown.

The inhibitor layer 300 may include a material that is dissociated by an acid or hydrogen cation. The inhibitor layer 300 may include a protecting group dissociated by an acid.

In some example embodiments, the inhibitor layer 300 may include a material strongly bound to the first layer 100. In some example embodiments, the inhibitor layer 300 may include a material bound to the first layer 100 with high selectivity. In some example embodiments, the inhibitor layer 300 may include a material strongly bound to the first layer 100 but weakly bonded to the second layer 200. For example, the material of the inhibitor layer 300 may be more strongly bound to the first layer 100 than the second layer 200.

Specifically, the inhibitor layer 300 may include a benzene ring. That is, the inhibitor layer 300 may include a material in which various functional groups are chemically bound to the benzene ring. For example, the inhibitor layer 300 may include at least one of 4-trifluoromethyl benzaldehyde (4-TFBA), 3,5-bis (trifluoromethyl)aniline), benzaldehyde, 4-trifluoromethyl aniline, aniline, benzene, 3-trifluoromethyl benzaldehyde, 4-trifluoromethyl acetophenone, 3,5-bis(trifluoromethyl)acetophenone, 3-trifluoromethyl acetophenone, 3-trifluoromethyl benzonitrile, 4-fluorotoluene, 3-fluorophenylacetylene, 4-trifluoromethyl benzoyl chloride, or 4-methylthio aniline, but is not limited thereto.

Figure 4:
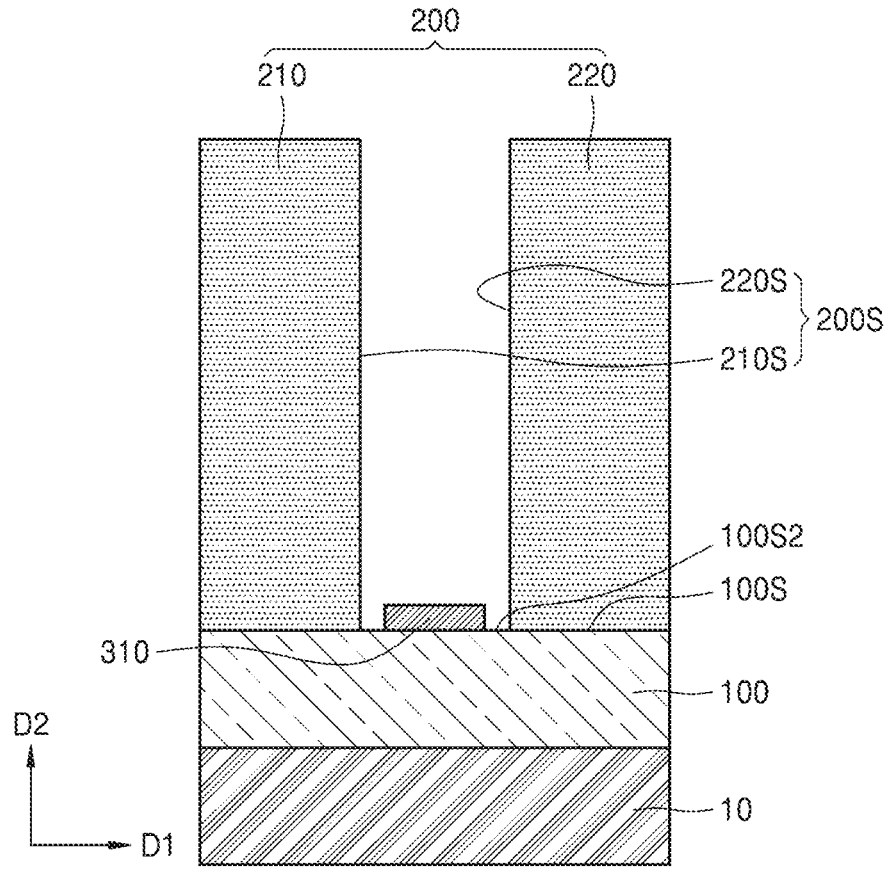

Referring to FIGS. 1A and 4, the second surface 200S may be exposed by selectively removing the inhibitor layer 300 on the second surface 200S of the second layer 200 (S130).

In some example embodiments, a part of the inhibitor layer 300 on the second surface 200S may be selectively removed through a heat treatment process. Specifically, the inhibitor layer 300 contacting the second surface 200S may be selectively removed through a heat treatment process. For example, the second inhibitor layer 320 and the first portion 311 contacting the second surface 200S may be removed through the heat treatment process. In some example embodiments, the second inhibitor layer 320 and the first portion 311 contacting the second surface 200S may be removed through a stimulus, such as heat, light, or electromagnetic waves applied to the second layer 200.

In some example embodiments, a part of the inhibitor layer 300 may not be removed through the heat treatment process. Specifically, the first inhibitor layer 310 may not be removed through the heat treatment process. That is, the first inhibitor layer 310 contacting only the first surface 100S may not be removed through the heat treatment process.

In some example embodiments, the second surface 200S may be exposed by selectively removing the inhibitor layer 300 on the second surface 200S through the heat treatment process. Specifically, the second surface 200S may be entirely exposed because the second inhibitor layer 320 and the first portion 311 contacting the second surface 200S are removed through the heat treatment process.

In some example embodiments, the first inhibitor layer 310 contacting only the first surface 100S may not be removed through the heat treatment process, but a part of the first surface 100S may be exposed because the first portion 311 contacting the first surface 100S and the second surface 200S is removed. For example, the second portion 100S2 of the first surface 100S may be exposed.

In some example embodiments, the heat treatment process may be performed under the condition of a temperature equal to or higher than exactly or about 200° C. and equal to or lower than exactly or about 250° C. In some example embodiments, the heat treatment process may be performed for at least exactly or about 1 minute. When the heat treatment process is performed on the inhibitor layer 300, the first inhibitor layer 310 on the first surface 100S may not be removed, and the second inhibitor layer 320 and the first portion 311 on the second surface 200S may be removed. That is, through the heat treatment process, the second inhibitor layer 320 and the first portion 311 contacting the second surface 200S may be selectively removed due to different physical properties of the first layer 100 and the second layer 200.

For example, when the heat treatment process is performed, hydrogen cations $H^+$ are released from the second layer 200. The released hydrogen cations $H^+$ may react with the second inhibitor layer 320 on the second surface 200S. Because the second inhibitor layer 320 includes a material dissociated by acid, when the second inhibitor layer 320 reacts with hydrogen cations $H^+$, the second inhibitor layer 320 may be dissociated. On the other hand, even if the heat treatment process is performed, hydrogen cations $H^+$ are not generated in the first layer 100. Accordingly, the first inhibitor layer 310 is not removed. One side of the first portion 311 is positioned in contact with the first surface 100S while the other side thereof is positioned in contact with the second surface 200S. Therefore, the first portion 311 may be dissociated by hydrogen cations $H^+$ released from the second layer 200.

Figure 5:
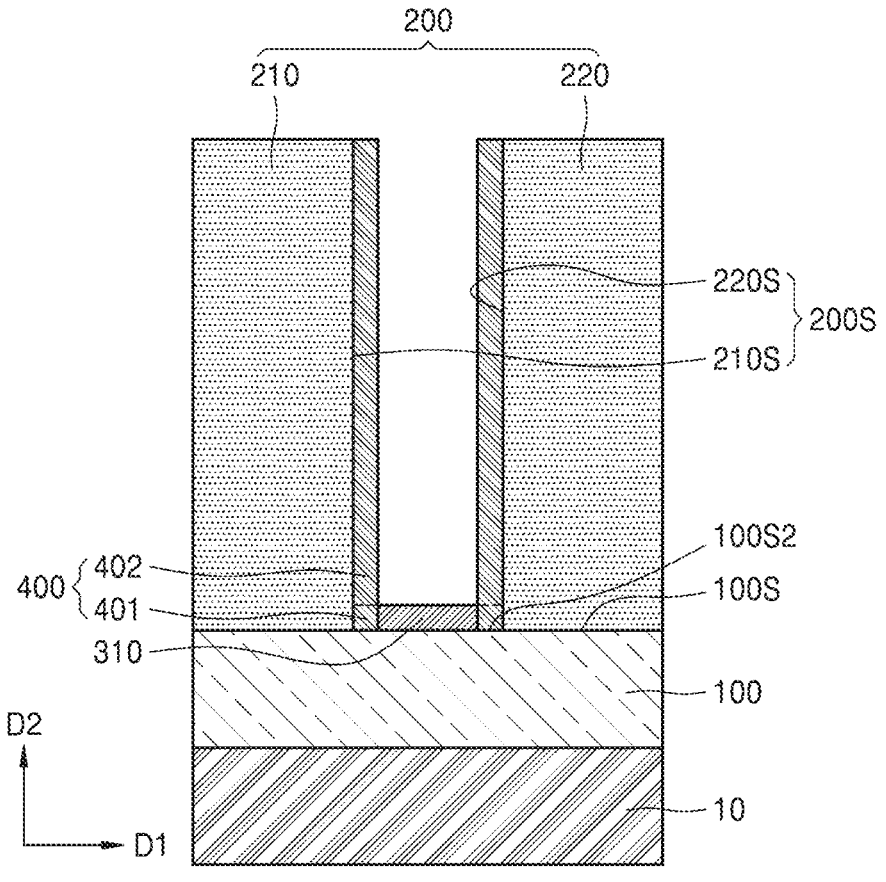

Referring to FIGS. 1A and 5, an interest layer 400 may be formed on the second surface 200S of the second layer 200 (S140).

In some example embodiments, the interest layer 400 may be deposited on the second surface 200S. For example, the interest layer 400 may be deposited using chemical vapor deposition (CVD). For example, the interest layer 400 may be deposited using atomic layer deposition (ALD). The interest layer 400 may include a first interest layer 401 contacting the first surface 100S and a second interest layer 402 contacting only the second surface 200S. That is, the interest layer 400 may be deposited on the second surface 200S and simultaneously deposited on a part of the first surface 100S.

As described above, because the first portion 311 contacting the first surface 100S and the second surface 200S is removed, a part of the first surface 100S may be exposed. For example, the second portion 100S2 of the first surface 100S may be exposed. A second interest layer 402 may be deposited on the exposed second portion 100S2 of the first surface 100S.

The interest layer 400 may include an organic material and an inorganic material. Specifically, the interest layer 400 may include various materials capable of a deposition process (e.g., CVD and ALD) in a temperature range in which the heat treatment process on the inhibitor layer 300 is performed, that is, for example, from exactly or about 200° C. to exactly or about 250° C. For example, the interest layer 400 may include tantalum nitride, aluminum oxide, hafnium oxide, niobium oxide, silicon oxide, etc. In some example embodiments, the interest layer 400 may include another material not described above because the temperature and environment of the heat treatment process change.

Referring to FIG. 1B, prior to forming the inhibitor layer 300 on the first surface 100S of the first layer 100 and the second surface 200S of the second layer 200 (S120), a pretreatment process may be performed on the first surface 100S of the first layer 100 (S111). Specifically, treating the first surface 100S of the first layer 100 with an HF aqueous solution, treating the first surface 100S with $H_2$ plasma, and/or treating the first surface 100S with $NH_3$ plasma may be performed.

The selectivity of a subsequent membrane formed on the first surface 100S of the first layer 100 and the second surface 200S of the second layer 200 may increase by the pretreatment process. The pretreatment process is described in detail with reference to FIGS. 12 to 15.

In some example embodiments, operations of FIGS. 4 and 5 may be performed through the same process. In other words, operation S130 of selectively removing the inhibitor layer 300 on the second surface 200S and operation S140 of forming the interest layer 400 on the second surface 200S may be performed through the same process. For example, because the heat treatment process is performed in the process of forming the interest layer 400, the second inhibitor layer 320 and the first portion 311 on the second surface 200S may be removed. That is, a separate heat treatment process of removing the second inhibitor layer 320 and the first portion 311 on the second surface 200S may not be performed.

Figure 6:
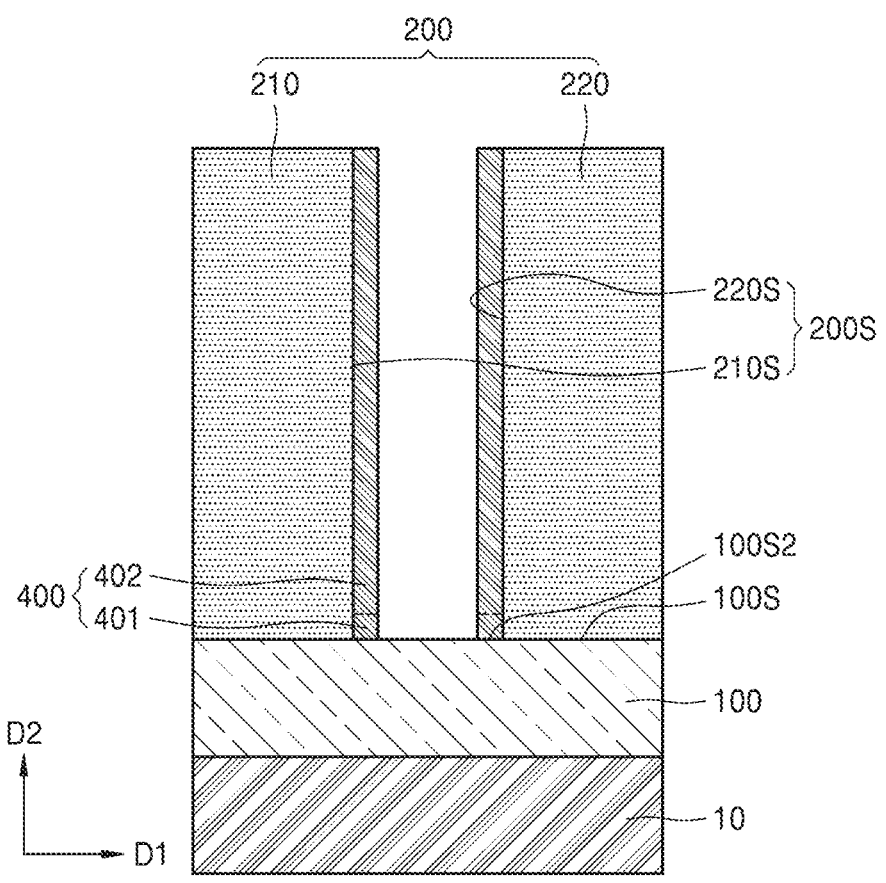

Referring to FIGS. 1C and 6, an operation of exposing the first surface 100S by removing the first inhibitor layer 310 may be further performed (S150).

In some example embodiments, an acid treatment may be used to remove the first inhibitor layer 310. As described above, the first inhibitor layer 310 may include a material capable of being dissociated by acid or hydrogen cations, and thus, the first inhibitor layer 310 may be removed by an acid treatment.

When the first inhibitor layer 310 is removed, the first surface 100S of the first layer 100 on which the first inhibitor layer 310 is formed may be exposed. Specifically, a part of the first surface 100S may be exposed. For example, a part of the first surface 100S on which the interest layer 400 is not formed may be exposed. For example, a part of the first surface 100S excluding the second portion 100S2 may be exposed.

Figure 7:
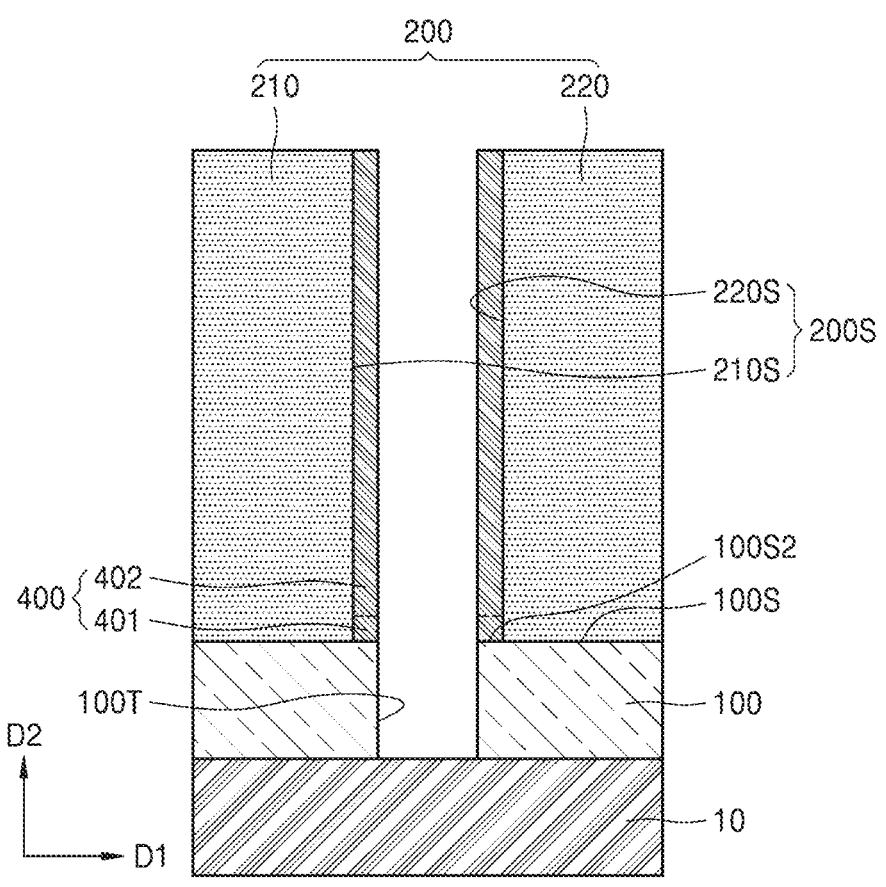

Referring to FIGS. 1C and 7, an operation of etching the first layer 100 exposed through the first surface 100S may be further performed (S160).

In some example embodiments, the first layer 100 exposed through the first surface 100S may be etched using a wet etching process. The first trench 100T may be formed by etching the first layer 100.

Figure 8:
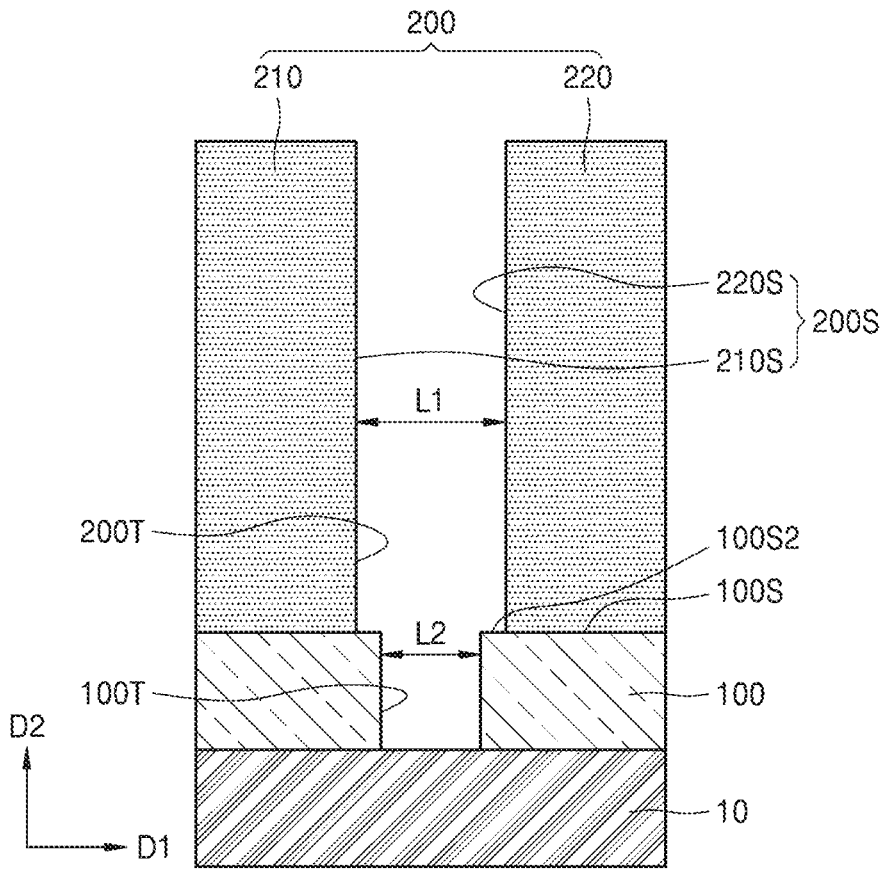

Referring to FIG. 8, the second surface 200S of the second layer 200 may be exposed by removing the interest layer 400. That is, a second trench 200T may be exposed by removing the interest layer 400.

In some example embodiments, a degree to which the first layer 100 is etched, that is, a width L1 of the first trench 100T, may be less than a degree to which the first and second sublayers 210 and 220 of the second layer 200 are spaced apart from each other, that is, a width L2 of the second trench 200T. That is, the first trench 100T having a narrower area than that of the second trench 200T may be formed.

In some example embodiments, as shown in FIGS. 2 to 5, because the inhibitor layer 300 of a partial region (e.g., the second portion 100S2) of the first surface 100S of the first layer 100 is removed, the first interest layer 401 may be formed on the second portion 100S2. Accordingly, when a first trench 100T is formed by etching the first layer 100 in the subsequent process of FIGS. 6 to 8, the first trench 100T having a narrow width may be formed. When the first interest layer 401 is not formed on the second portion 100S2, the first surface 100S is entirely exposed in FIG. 6, and thus, a trench having an intended width may not be formed.

In some example embodiments, the operations shown in FIGS. 6 to 8 may be performed through the same process. For example, because a wet etching process of etching the first layer 100 is performed, the first inhibitor layer 310 that may be dissociated by acid is removed, and the exposed first layer 100 is etched so that the first trench 100T may be formed, and the interest layer 400 may be removed. That is, a separate acid treatment process of removing the first inhibitor layer 310 and the interest layer 400 may not be separately performed. This is described below in detail with reference to FIGS. 11 and 17 to 24.

FIGS. 9A, 9B, 10, and 11 are graphs illustrating experimental data of some example embodiments to describe a method of manufacturing a semiconductor device according to some example embodiments.

Figure 9A:
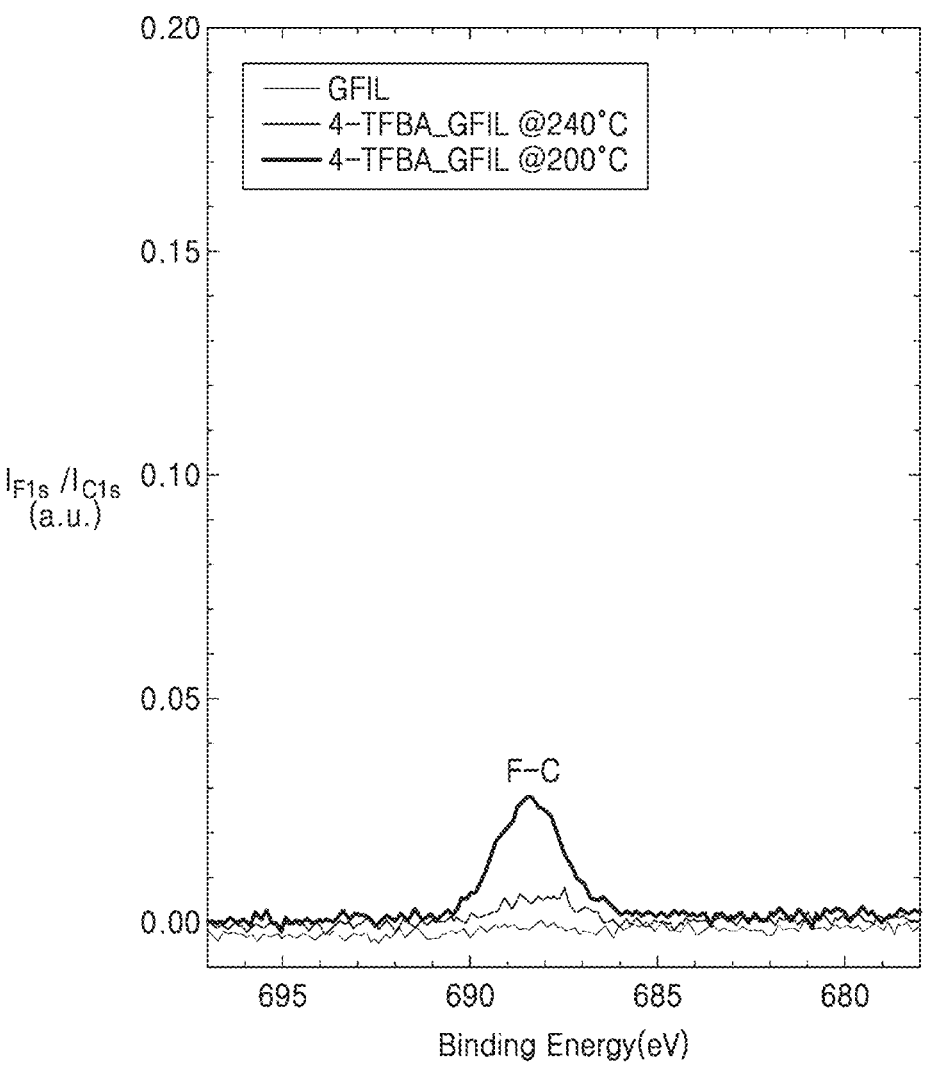
FIGS. 9A, 9B, 10, and 11 are graphs illustrating experimental data of some example embodiments to describe a method of manufacturing a semiconductor device according to some example embodiments.
Figure 9B:
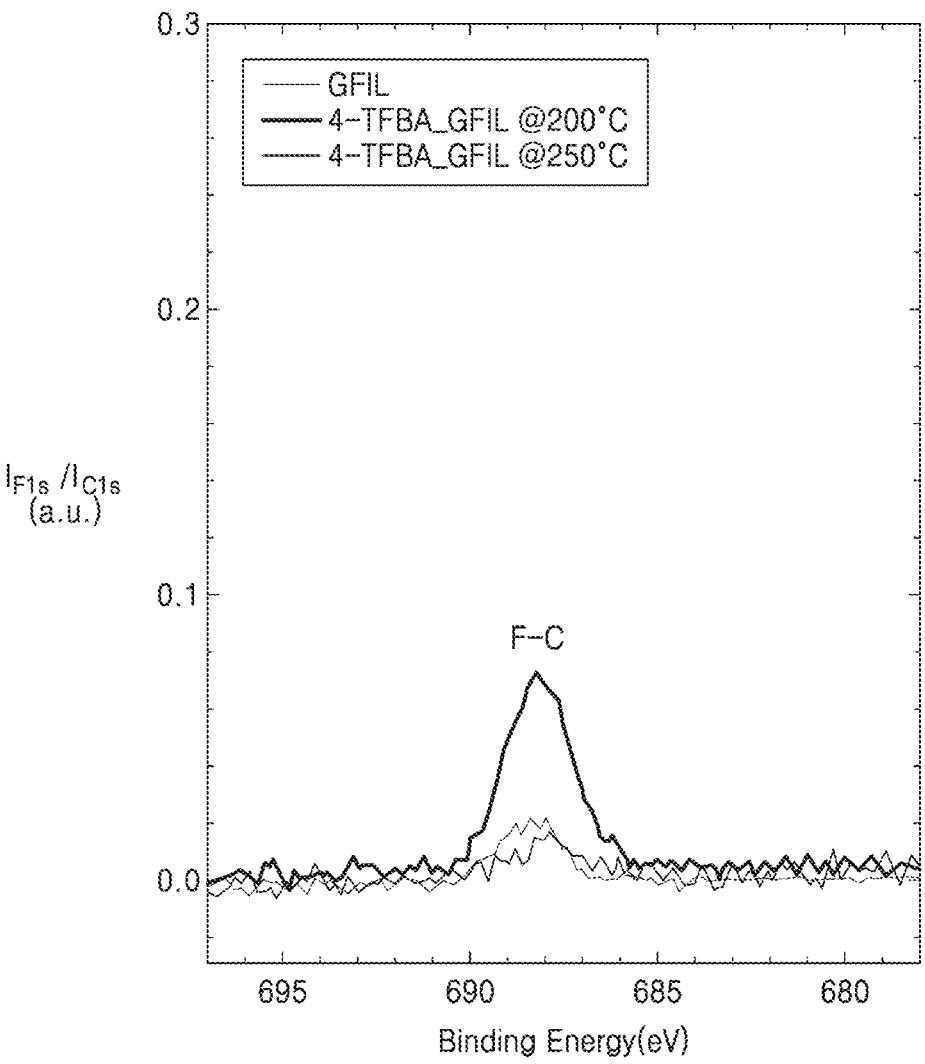

FIGS. 9A and 9B are graphs confirming a degree to which the inhibitor layer 300 is bound onto the second layer 200 when a heat treatment is performed. Specifically, FIGS. 9A and 9B are graphs confirming the F-C peak at a temperature of about 200° C., about 240° C., and about 250° C. by applying 4-TFBA to a gap-fill insulating layer.

Referring to FIGS. 9A and 9B, it may be understood that the magnitude of the F-C peak is observed to be the largest at about 200° C., but the F-C peak is reduced at temperatures of about 240° C. and about 250° C. That is, it may be understood that 4-TFBA is desorbed from the surface of the gap-fill insulating layer by a heat treatment. It may be expected that hydrogen cations are released from the gap-fill insulating layer by the heat treatment so that 4-TFBA on the gap-fill insulating layer is dissociated and desorbed. In particular, it may be understood that the magnitude of the F-C peak is almost similar to that of the gap-fill insulating layer on which 4-TFBA is not applied at a temperature of about 250° C., and accordingly, it may be expected that 4-TFBA is completely desorbed.

Figure 10:
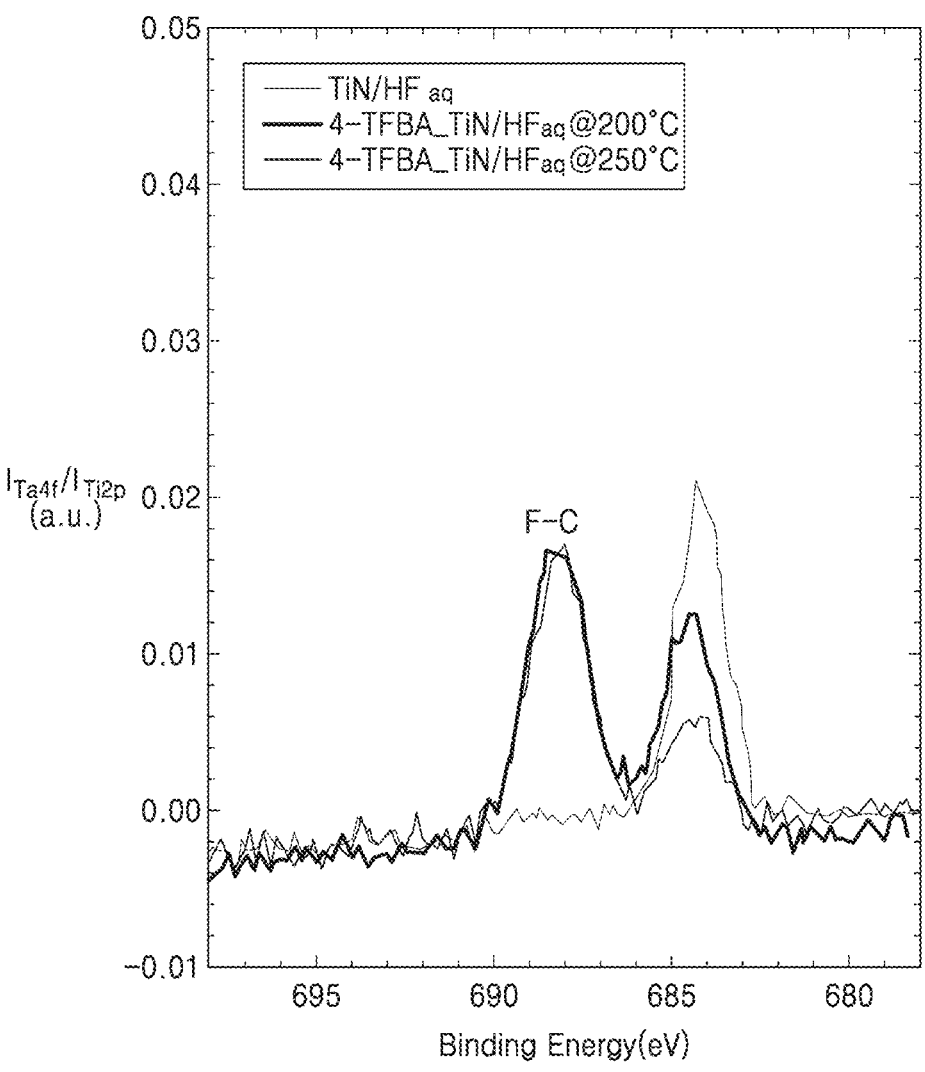

FIG. 10 is a graph confirming that the inhibitor layer 300 maintains a binding state on the first layer 100 even after a heat treatment. Specifically, FIG. 10 is a graph confirming the F-C peak at the temperatures of about 200° C. and about 240° C. by applying 4-TFBA to a TiN surface.

Referring to FIG. 10, it may be observed that the magnitude of the F-C peak is almost not reduced regardless of the temperature, and it may be observed that the magnitude of the F-C peak increases when compared to the case of TiN to which 4-TFBA is not applied. Accordingly, it may be confirmed (e.g., understood) that 4-TFBA is strongly bound to TiN even after the heat treatment.

Figure 11:
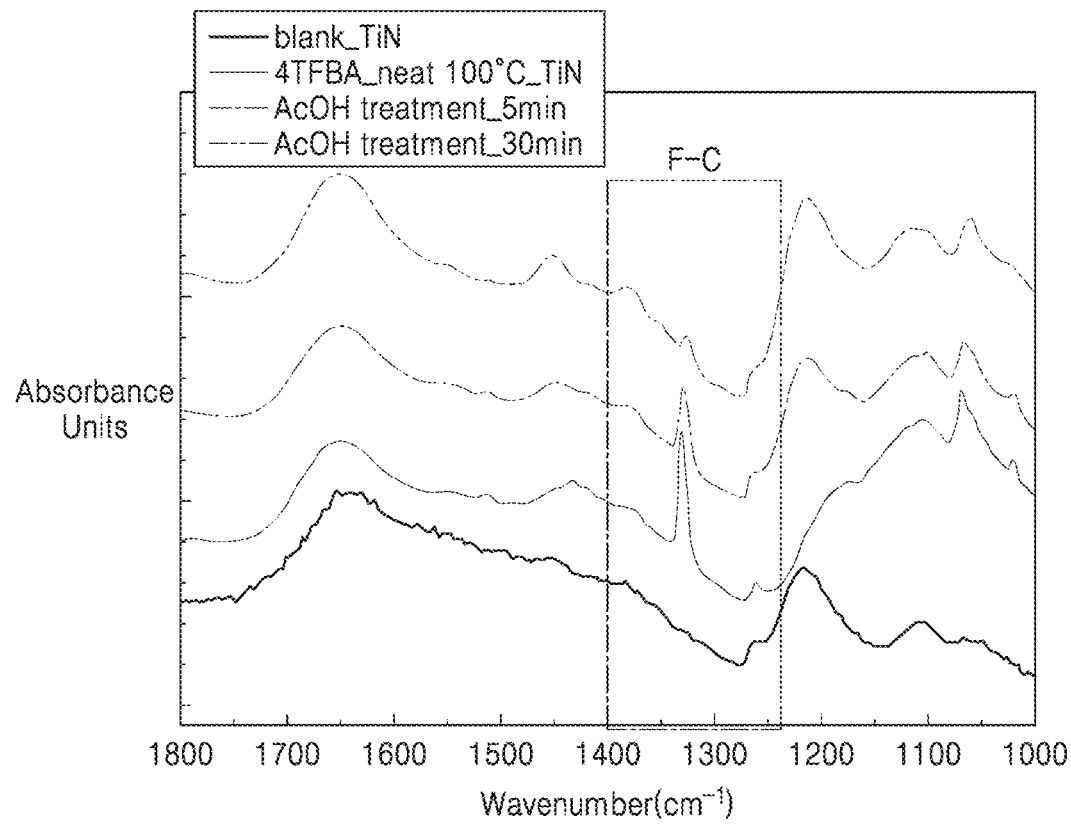

FIG. 11 is a graph confirming whether the inhibitor layer 300 is dissociated and desorbed by acid, as predicted through the previous experimental results. Specifically, FIG. 11 is a graph confirming the F-C peak when the TiN surface to which 4-TFBA is bound is treated with acid.

Referring to FIG. 11, it may be observed that while the magnitude of the F-C peak is observed to be large with respect to the TiN surface to which 4-TFBA is bound, the magnitude of the F-C peak is reduced when the TiN surface to which 4-TFBA is bound is acid treated with a 0.6% acetic acid solution. In particular, it may be observed that the magnitude of the F-C peak is slightly reduced when the TiN surface to which 4-TFBA is bound is acid treated for 5 minutes, compared to when the TiN surface to which 4-TFBA is bound is not acid treated, whereas the magnitude of the F-C peak is greatly reduced when the TiN surface to which 4-TFBA is bound is acid treated for 30 minutes.

That is, from the experimental results of FIGS. 9A, 9B, 10, and 11, it may be confirmed (e.g., understood) that 4-TFBA is strongly bound to the TiN surface, but is desorbed from the surface of the gap-fill insulating layer by the heat treatment. In other words, it may be confirmed (e.g., understood) that 4-TFBA has high selectivity with respect to TiN. In addition, it may be confirmed (e.g., understood) that 4-TFBA has high selectivity with respect to TiN because 4-TFBA is dissociated and desorbed by acid.

In addition, because even 4-TFBA bound to the TiN surface is desorbed when additionally acid treated, a separate acid treatment process to remove 4-TFBA may not be required when a wet etching process including the acid treatment is performed in a subsequent process of manufacturing the semiconductor device according to the inventive concepts.

Figure 12:
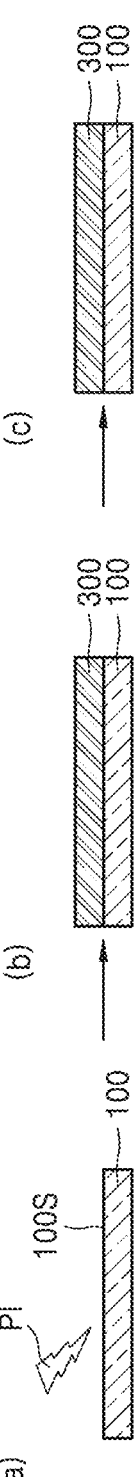
FIGS. 12 and 13 are schematic diagrams of pretreatment processes to describe a method of manufacturing a semiconductor device according to some example embodiments.
Figure 13:
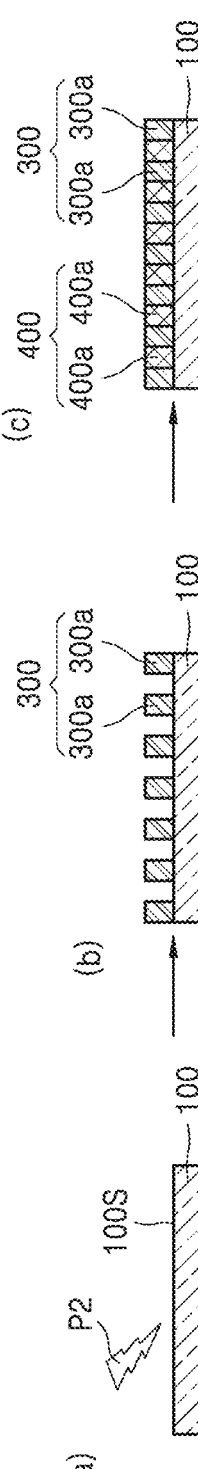

FIGS. 12 and 13 are schematic diagrams of pretreatment processes to describe a method of manufacturing a semiconductor device according to some example embodiments. Specifically, FIGS. 12 and 13 are schematic diagrams showing whether and how the inhibitor layer 300 and the interest layer 400 are formed when pretreatment processes P1 and P2 are performed and are not performed.

Referring to FIG. 12, the pretreatment process P1 may be performed on the first surface 100S of the first layer 100. The pretreatment process P1 may include, for example, a process of treating the first surface 100S of the first layer 100 with H$_2$ plasma.

As shown in (a), (b) and (c) of FIG. 12, when the inhibitor layer 300 and the interest layer 400 are applied to the first surface 100S after the pretreatment process P1 is performed, a coverage of the inhibitor layer 300 is high, and thus, the first surface 100S may be completely covered, and formation of the interest layer 400 may be inhibited by the inhibitor layer 300.

Referring to FIG. 13, the pretreatment process P2 may be performed on the first surface 100S of the first layer 100. The pretreatment process P2 may include, for example, a process of treating the first surface 100S of the first layer 100 with an HF aqueous solution or a process of treating the first surface 100S with NH$_3$ plasma.

As shown in (a), (b) and (c) of FIG. 13, when the inhibitor layer 300 and the interest layer 400 are applied to the first surface 100S after the pretreatment process P2 is performed, the coverage of the inhibitor layer 300 is low, and thus, the first surface 100S may not be completely covered, and accordingly, the formation of the interest layer 400 may not be completely inhibited. Specifically, the inhibitor layer 300 may be formed on a partial region of the first surface 100S, and the interest layer 400 may be formed on another partial region of the first surface 100S not covered by the inhibitor layer 300.

FIGS. 14, 15A, 15B, 15C, and 15D are graphs illustrating experimental data related to pretreatment processes to describe a method of manufacturing a semiconductor device according to some example embodiments.

Figure 14:
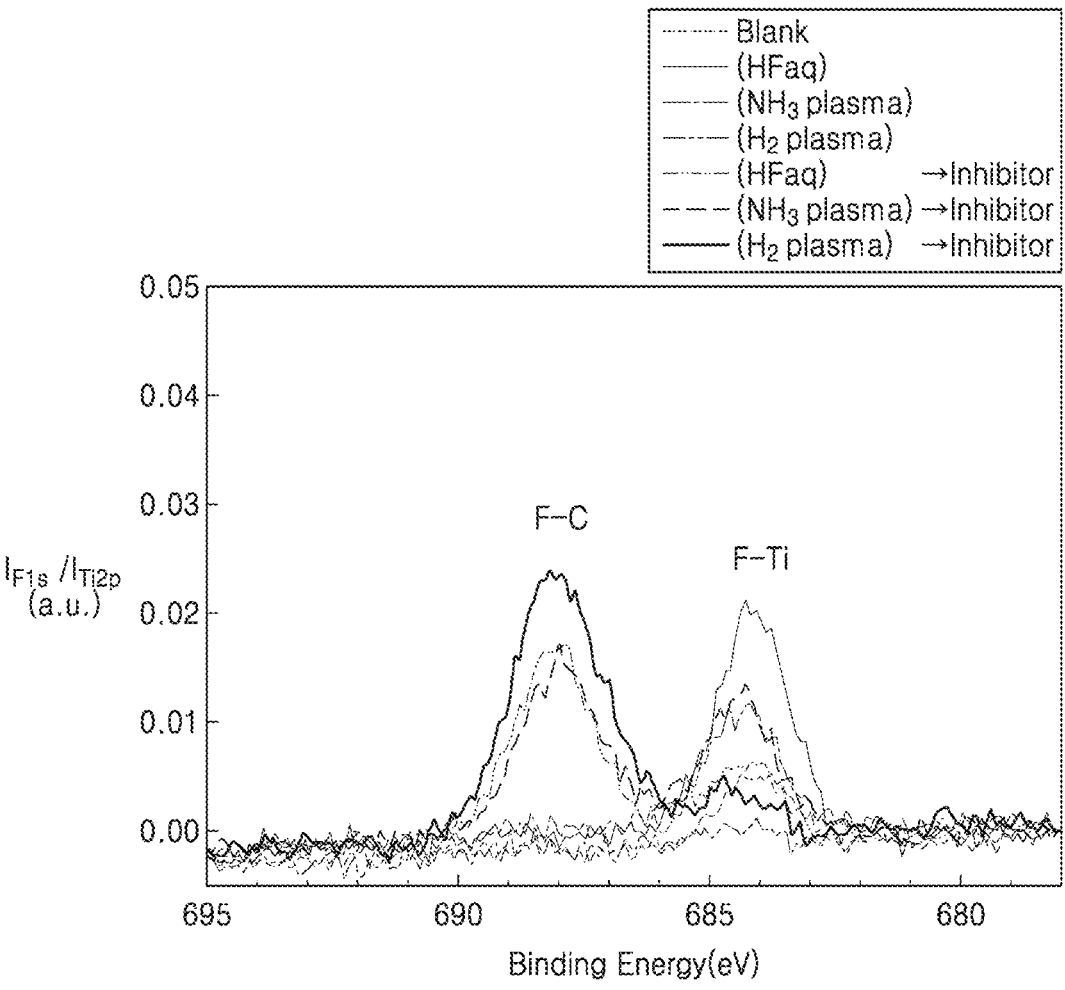
FIGS. 14, 15A, 15B, 15C, and 15D are graphs illustrating experimental data related to pretreatment processes to describe a method of manufacturing a semiconductor device according to some example embodiments.
Figure 15A:
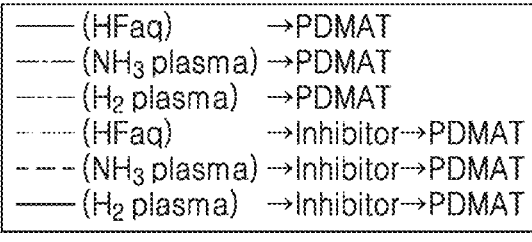
Figure 15A:
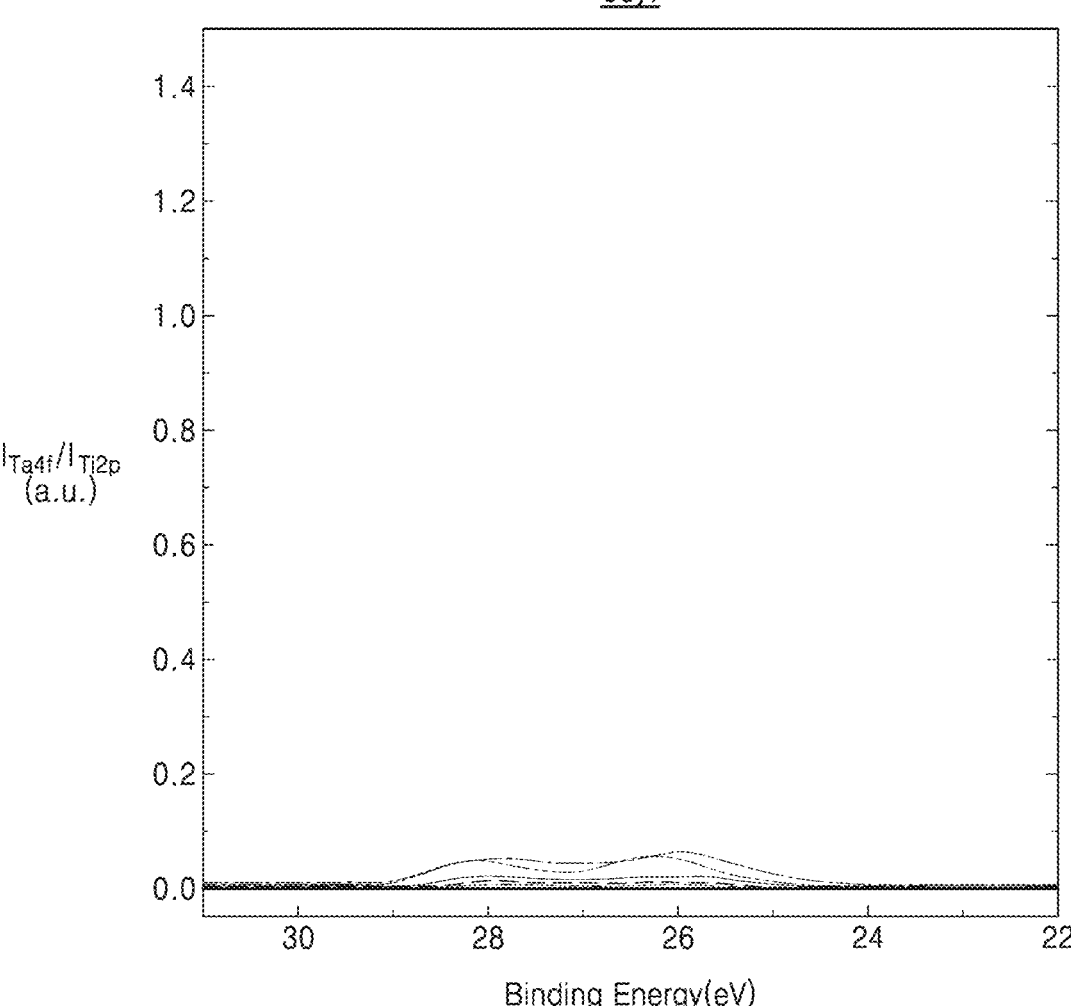
Figure 15B:
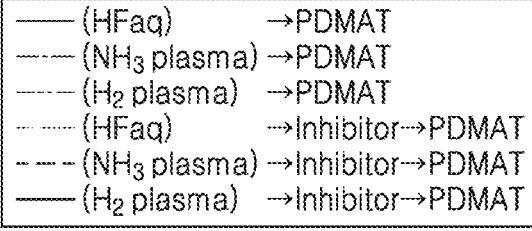
Figure 15B:
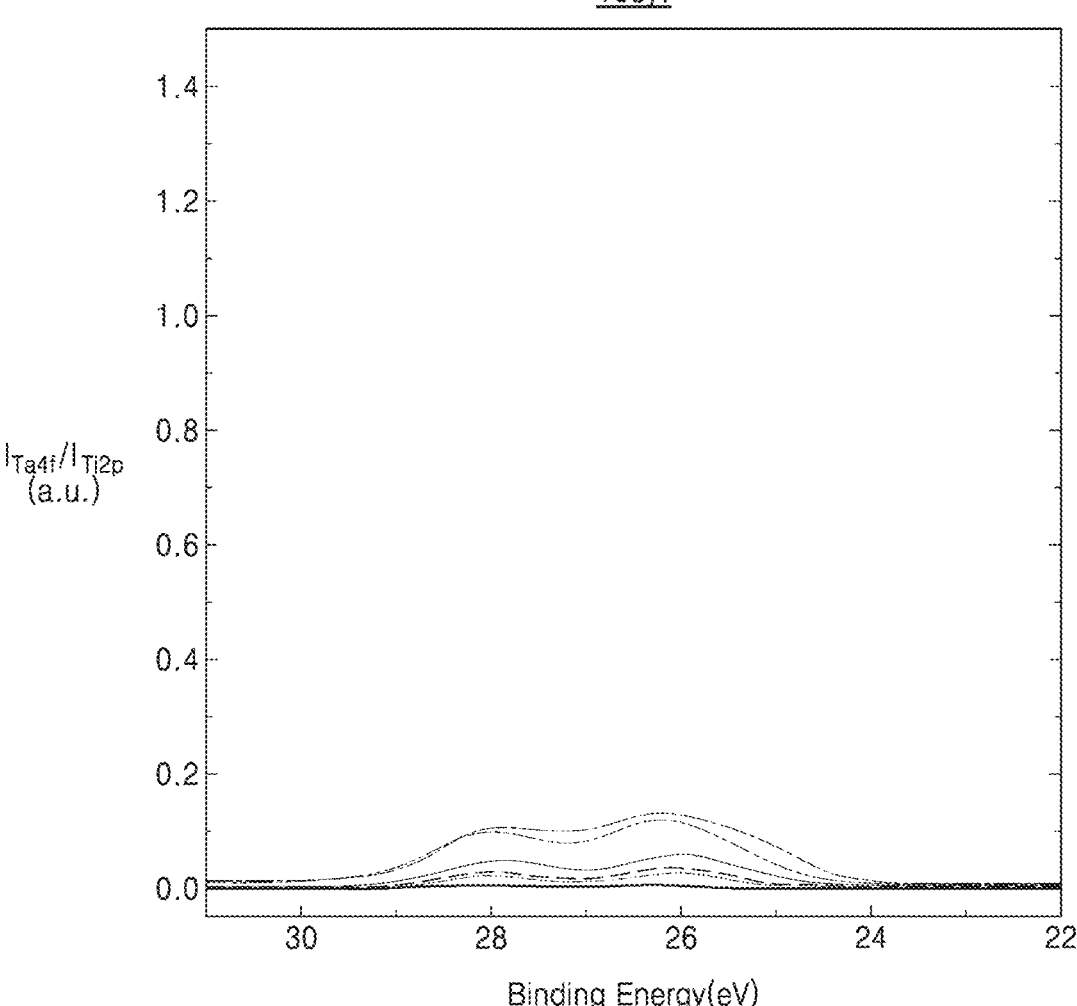
Figure 15C:
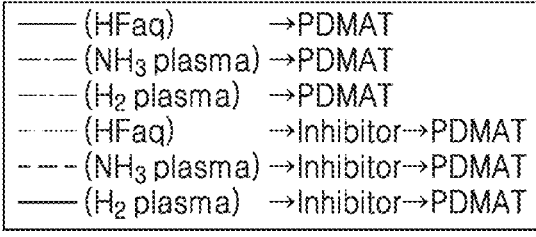
Figure 15C:
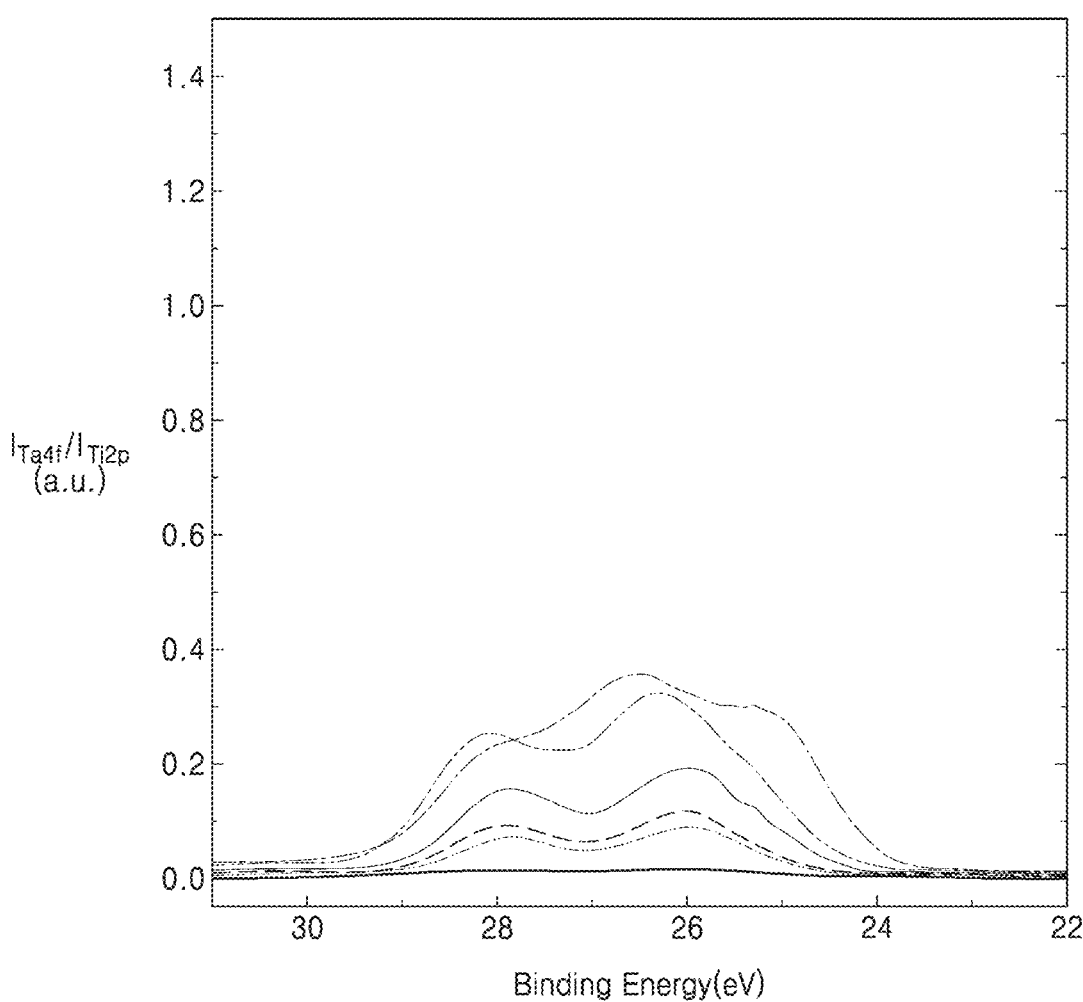
Figure 15D:
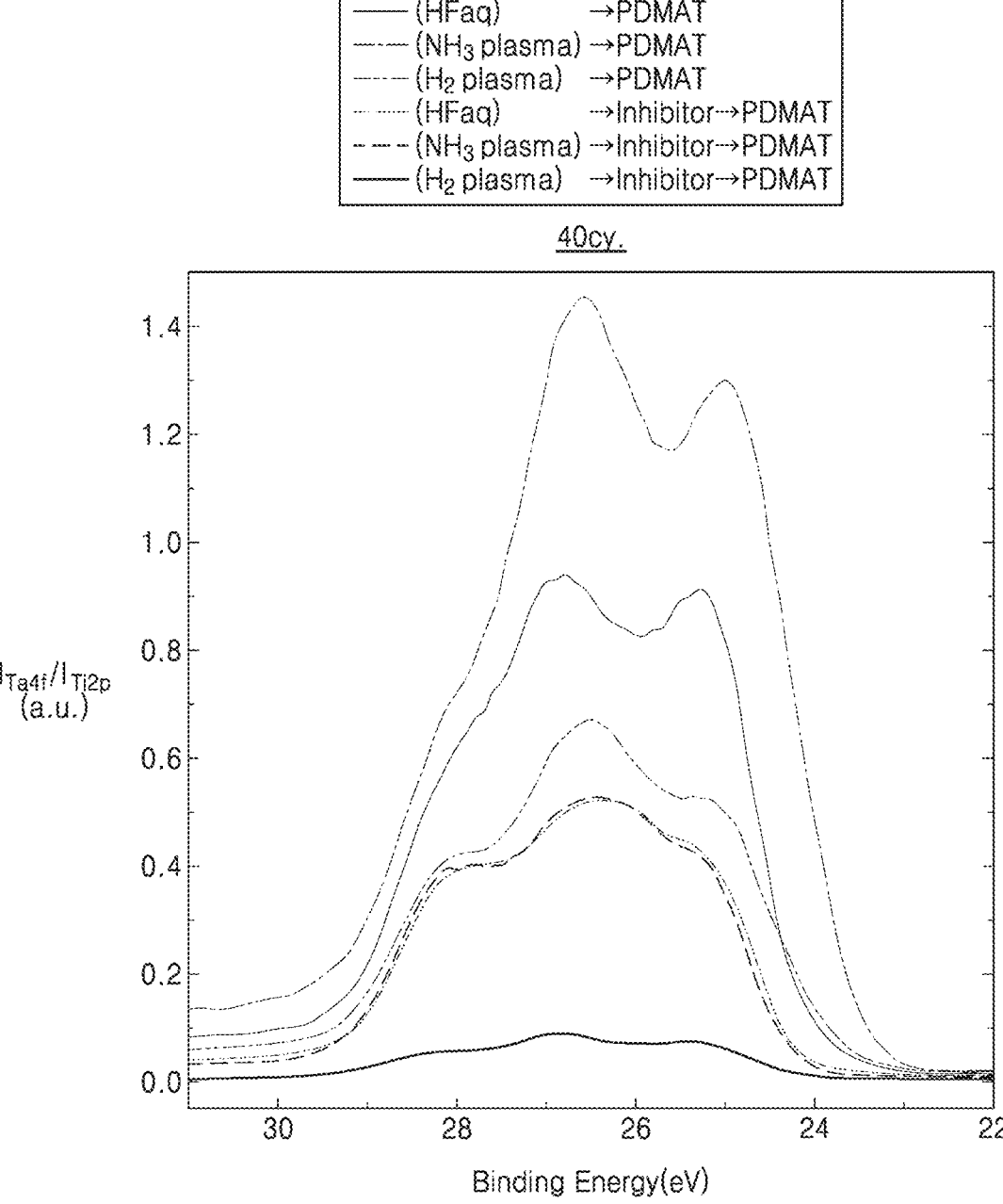

FIG. 14 are graphs confirming the F-C peak and the F-Ti peak when an inhibitor layer is deposited after a pretreatment process. Specifically, FIG. 14 are graphs confirming the F-C peak and the F-Ti peak when an inhibitor layer is deposited on TiN pretreated with an HF aqueous solution, $NH_3$ plasma, and $H_2$ plasma at a temperature of about 250° C.

Referring to FIG. 14, it may be observed that magnitudes of the F-C peak and the F-Ti peak are different from each other for each pretreatment process.

Specifically, it may be confirmed (e.g., understood) that the magnitude of the F-Ti peak when the inhibitor layer is not deposited is reduced in the order of pretreatment with the HF aqueous solution, pretreatment with $NH_3$ plasma, no pretreatment (blank), and pretreatment with $H_2$ plasma. That is, it may be predicted that F-Ti groups are generated on the TiN surface in the cases of pretreatment with the HF aqueous solution and pretreatment with $NH_3$ plasma. On the other hand, in the case of pretreatment with $H_2$ plasma, it may be predicted that the F-Ti group present before performing the pretreatment process is removed.

Next, it may be confirmed (e.g., understood) that the magnitude of the F-C peak is reduced in the order of pretreatment with $H_2$ plasma, pretreatment with $NH_3$ plasma, and pretreatment with the HF aqueous solution. That is, it may be confirmed (e.g., understood) that the degree to which the inhibitor layer is deposited on the TiN surface is in the reverse order of the magnitudes of the F-Ti peak discussed above.

From this, it may be confirmed (e.g., understood) that the pretreatment of the TiN surface using $H_2$ plasma is more appropriate, but the inventive concepts are not limited thereto, and the pretreatment with $NH_3$ plasma and the pretreatment with the HF aqueous solution may also be included.

The results of FIG. 14 are shown in Table 1 as numeral values below.

TABLE 1

| Treatment | F—C | F—Ti |
| --- | --- | --- |
| Blank | 0 | 0.39 |
| $HF_{aq.}$ | 0 | 1 |
| $NH_3$ plasma | 0 | 0.49 |
| $H_2$ plasma | 0 | 0 |
| $HF_{aq.}$ →Inhibitor | 0.66 | 0.24 |
| $NH_3$ plasma →Inhibitor | 0.68 | 0.47 |
| $H_2$ plasma →Inhibitor | 0.93 | 0.15 |

FIGS. 15A to 15D are graphs confirming the F-C peak and the F-Ti peak according to whether an inhibitor layer is present when an interest layer is formed after a pretreatment process. Specifically, FIGS. 15A to 15D are graphs confirming the F-C peak and the F-Ti peak according to whether the inhibitor layer is present when the interest layer (e.g., TaN) is formed by applying pentakis(dimethylamino)tantalum(V) (PDMAT) to TiN pretreated with an HF aqueous solution, $NH_3$ plasma, and $H_2$ plasma at a temperature of about 250° C. FIGS. 15A to 15D show results of a process of applying the PDMAT after 5 cycles, 10 cycles, 20 cycles, and 40 cycles, respectively.

Referring to FIGS. 15A to 15D, a degree to which the inhibitor layer formed on the TiN surface inhibits the formation of the interest layer may be determined by comparing magnitudes of the peak when the inhibitor layer is present and when the inhibitor layer is not present. It may be confirmed (e.g., understood) that the degree to which the inhibitor layer formed on the TiN surface inhibits the formation of the interest layer is reduced in the order of pretreatment with $H_2$ plasma, pretreatment with $NH_3$ plasma, and pretreatment with an HF aqueous solution. That is, it may be confirmed (e.g., understood) that the ability of the inhibitor layer to inhibit the formation of the interest layer is proportional to the magnitude of the F-C peak of FIG. 14, that is, the degree to which the inhibitor layer is deposited.

The results of FIGS. 15A to 15D are shown in Table 2 as numerical values below.

TABLE 2

| | w/o:w/Inhibitor | | | |
| --- | --- | --- | --- | --- |
| Pre-treatment | PDMAT 5 cy. | 10 cy. | 20 cy. | 40 cy. |
| $HF_{aq.}$ | 1:0.53 | 1:0.51 | 1:0.44 | 1:0.54 |
| $NH_3$ plasma | 1:0.25 | 1:0.21 | 1:0.26 | 1:0.35 |
| $H_2$ plasma | 1:0.04 | 1:0.03 | 1:0.04 | 1:0.13 |

Referring to Table 1, it may be seen that the magnitude of the Ti-F peak on the TiN surface after the pretreatment process is in inverse proportion to the degree to which the inhibitor layer is deposited, that is, the magnitude of the F-C peak. In addition, referring to Table 2, it may be confirmed (e.g., understood) that the degree of deposition of the interest layer varies depending on the presence of the inhibitor layer, and the ratio is 25 or more up to 20 cycles in the case of pretreatment with $H_2$ plasma, about 1.9 or more in the case of pretreatment with the HF aqueous solution, and about 3.8 or more in the case of pretreatment with $NH_3$ plasma. It may be confirmed (e.g., understood) that the ratio is about 7.7 or more even in 40 cycles in the case of pretreatment with $H_2$ plasma.

Figure 16A:
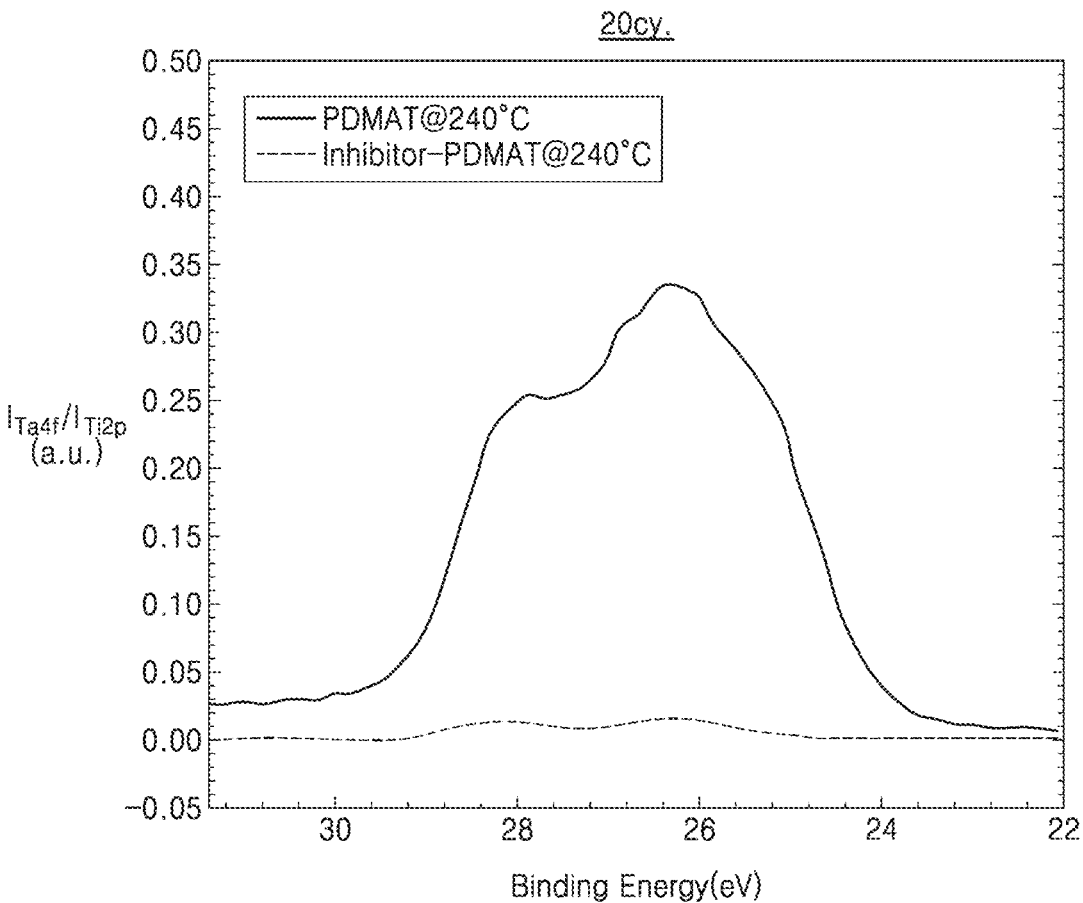
FIGS. 16A and 16B are graphs illustrating experimental data of some example embodiments to describe a method of manufacturing a semiconductor device according to some example embodiments.
Figure 16B:
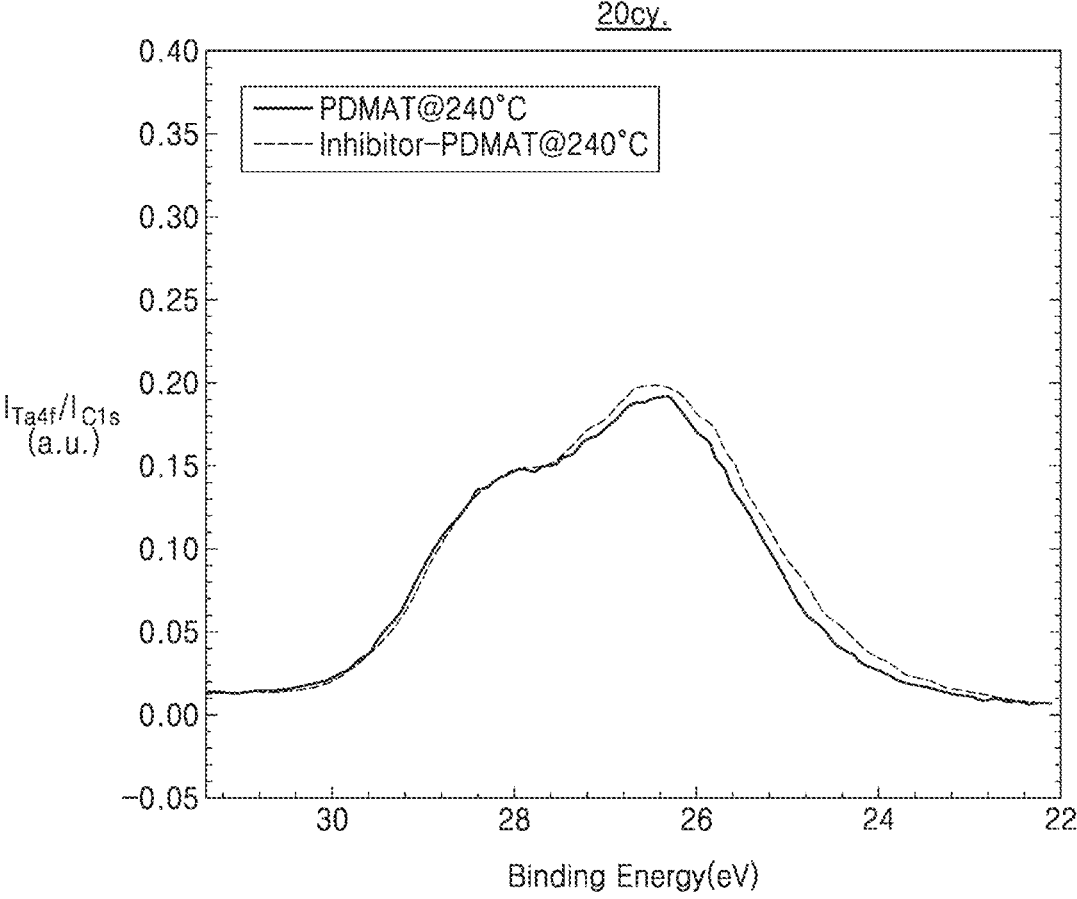

FIGS. 16A and 16B are graphs illustrating experimental data of some example embodiments to describe a method of manufacturing a semiconductor device according to some example embodiments. Specifically, FIGS. 16A and 16B are graphs confirming results produced to be similar to those of an experiment performed at a temperature of about 250° C. when the interest layer is applied after depositing the inhibitor layer on the TiN surface and the surface of the gap-fill insulating layer at a temperature of about 240° C.

Referring to FIG. 16A, when the PDMAT is treated after depositing the inhibitor layer on the TiN surface, the magnitude of the peak is greatly reduced, but referring to FIG. 16B, it may be observed that the magnitude of the peak is not reduced even though the PDMAT is treated after depositing the inhibitor layer on the surface of the gap-fill insulating layer. That is, similar to the results of a previous experiment performed at a temperature of about 250° C., it may be confirmed (e.g., understood) that the inhibitor layer is deposited with a high selectivity on the TiN surface, and thus, the formation of a subsequent interest layer may be inhibited.

FIGS. 17 to 24 are schematic diagrams of a wet etching process and diagrams of electron microscope observation results to describe a method of manufacturing a semiconductor device according to some example embodiments.

Figure 17:
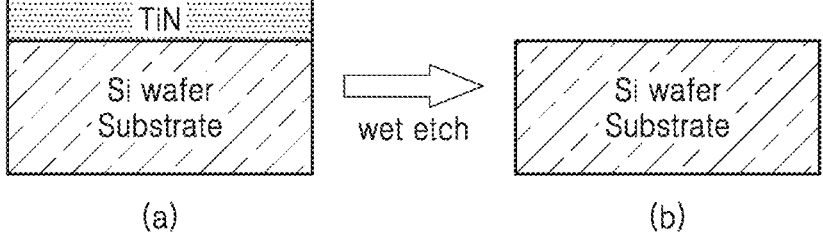
FIGS. 17 to 24 are schematic diagrams of a wet etching process and diagrams of electron microscope observation results to describe a method of manufacturing a semiconductor device according to some example embodiments.
Figure 18:
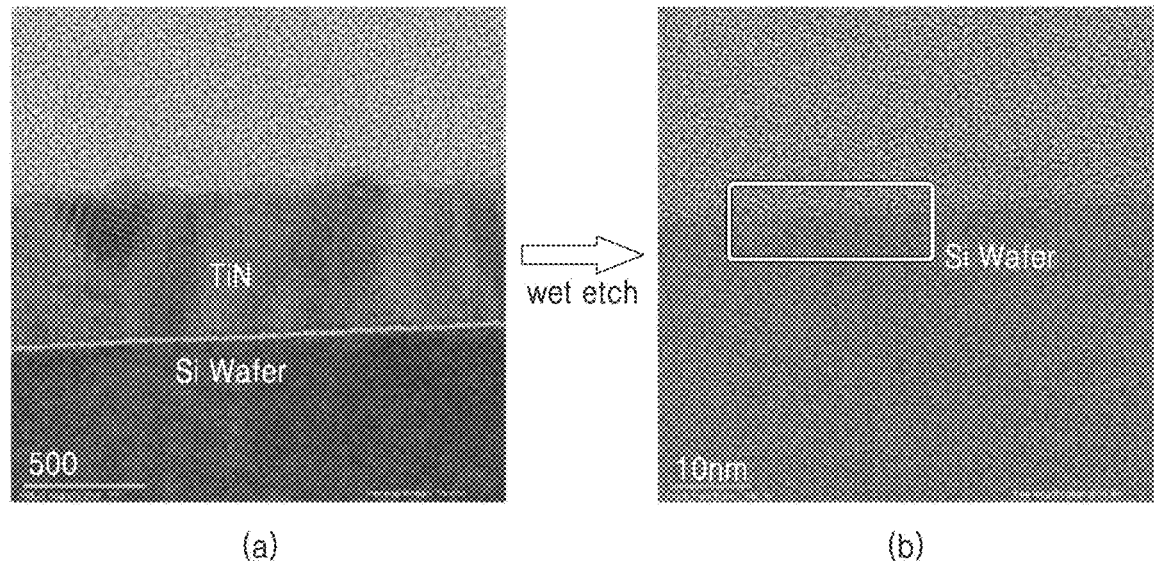

Referring to FIG. 17, TiN is removed by the wet etching process. Referring to the electron microscope observation results of FIG. 18 together, it may be confirmed (e.g., understood) that TiN is removed. In particular, it may be confirmed (e.g., understood) that TiN is removed without a wet delay.

Figure 19:
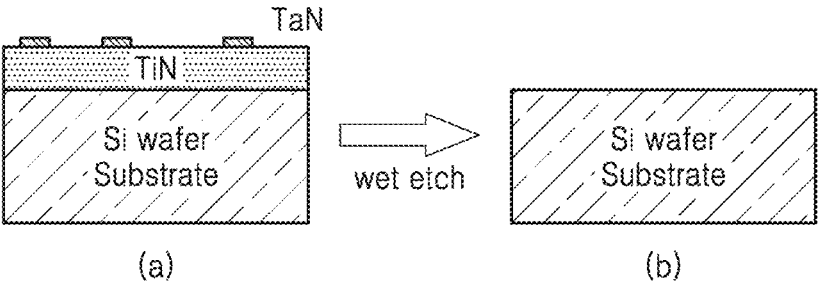
Figure 20:
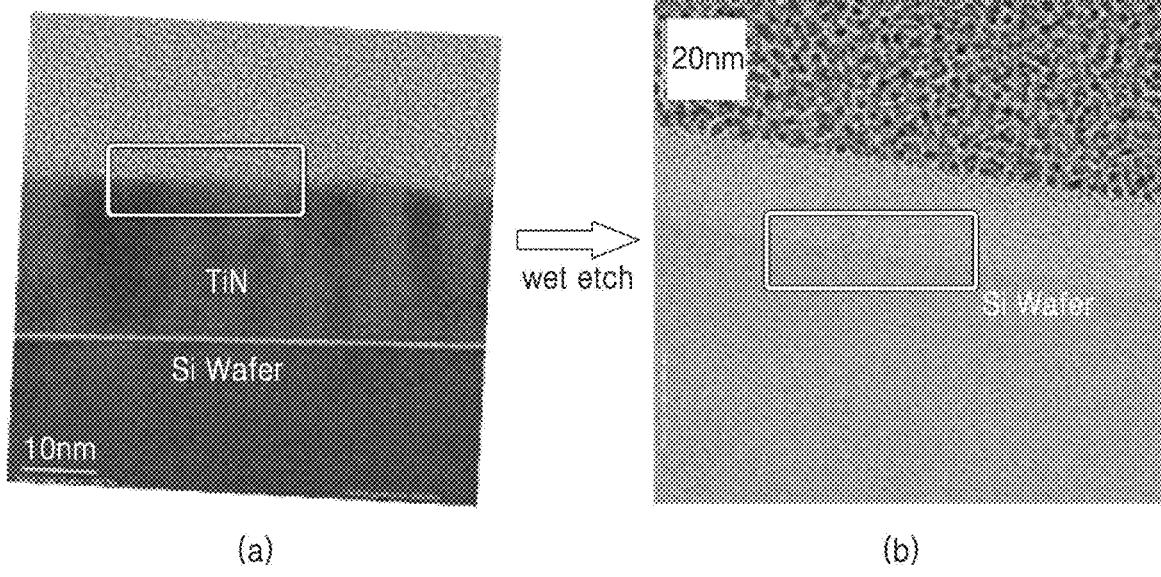

Referring to FIG. 19, TiN and TaN applied on TiN are removed by the wet etching process. Referring to the electron microscope observation results of FIG. 20 together, it may be observed that TiN and TaN are removed. In particular, it may be observed that no TaN residue remains and simultaneously TiN is removed without the wet delay.

Figure 21:
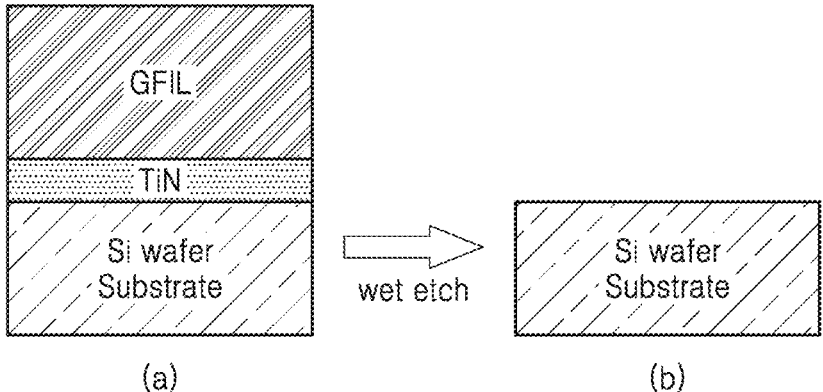
Figure 22:
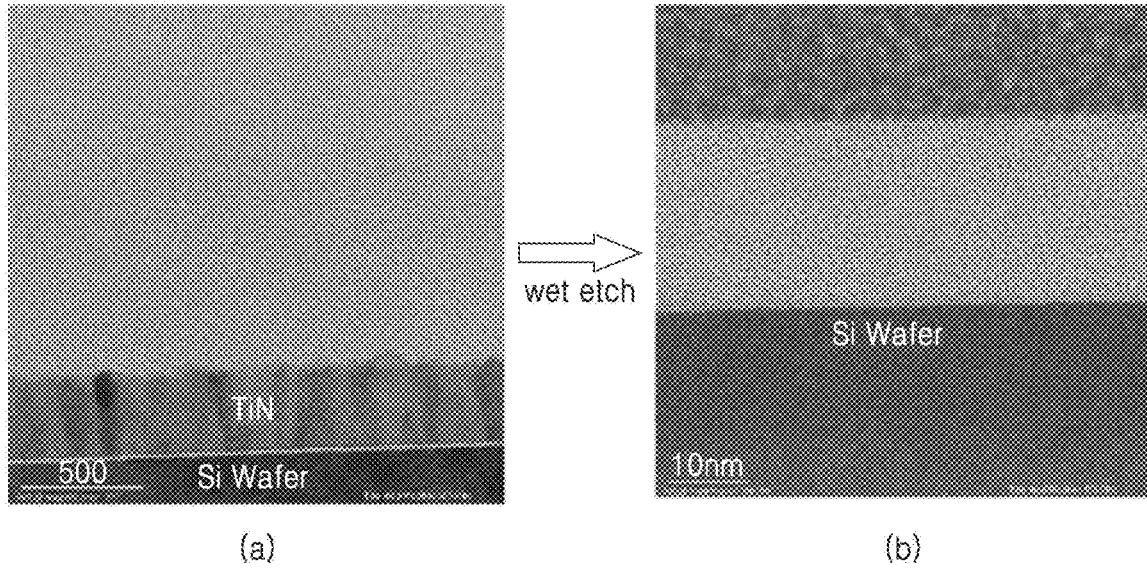

Referring to FIG. 21, TiN and the gap-fill insulating layer applied on TiN are removed by the wet etching process. Referring to the electron microscope observation results of FIG. 22 together, it may be observed that TiN and the gap-fill insulating layer applied on TiN are removed.

Figure 23:
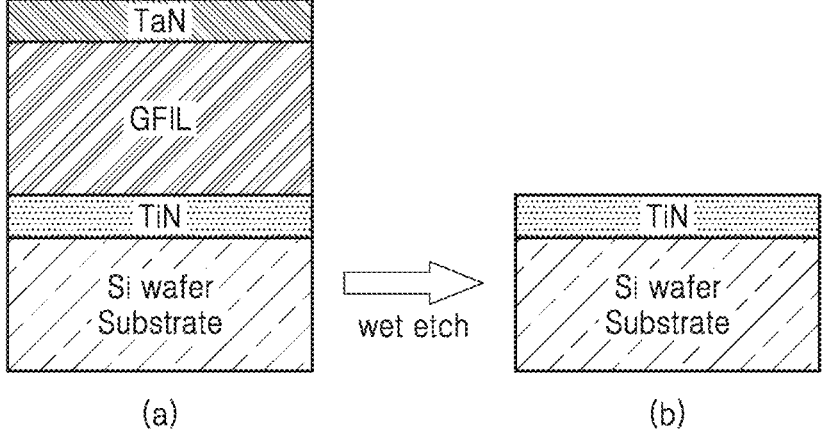
Figure 24:
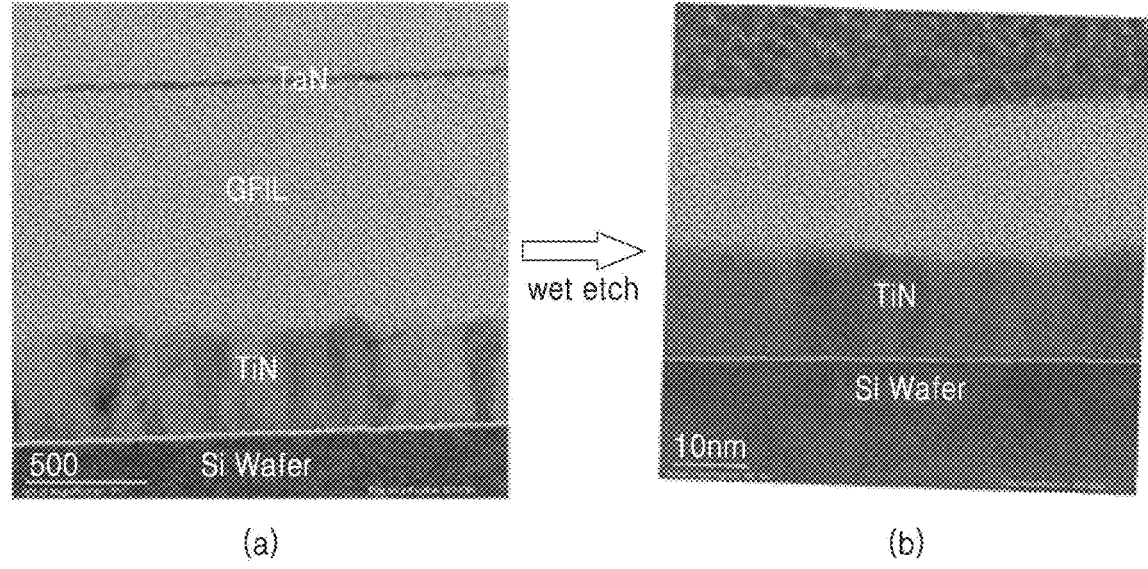

Referring to FIG. 23, a gap-fill insulating layer applied on TiN and TaN on the gap-fill insulating layer are removed by the wet etching process, whereas TiN is not removed. Referring to the electron microscope observation results of FIG. 24 together, it may be observed that the gap-fill insulating layer and TaN on the gap-fill insulating layer are removed, whereas TiN remains on a substrate. That is, it may be observed that no TaN residue remains and simultaneously, TiN is not removed due to the wet delay.

It may be seen from FIGS. 17 to 24 that TiN and TaN formed on the substrate do not require a separate removal process and are removed by the wet etching process for etching TiN.

FIGS. 25 and 26A to 26C are graphs illustrating experimental data of some example embodiments to describe a method of manufacturing a semiconductor device according to some example embodiments. Specifically, FIGS. 25 and 26A to 26C are graphs confirming the performance of inhibiting the formation of a subsequent interest layer when 3,5-Bis(trifluoromethyl)aniline (BTFMA) having a benzene ring is used as an inhibitor layer.

Figure 25:
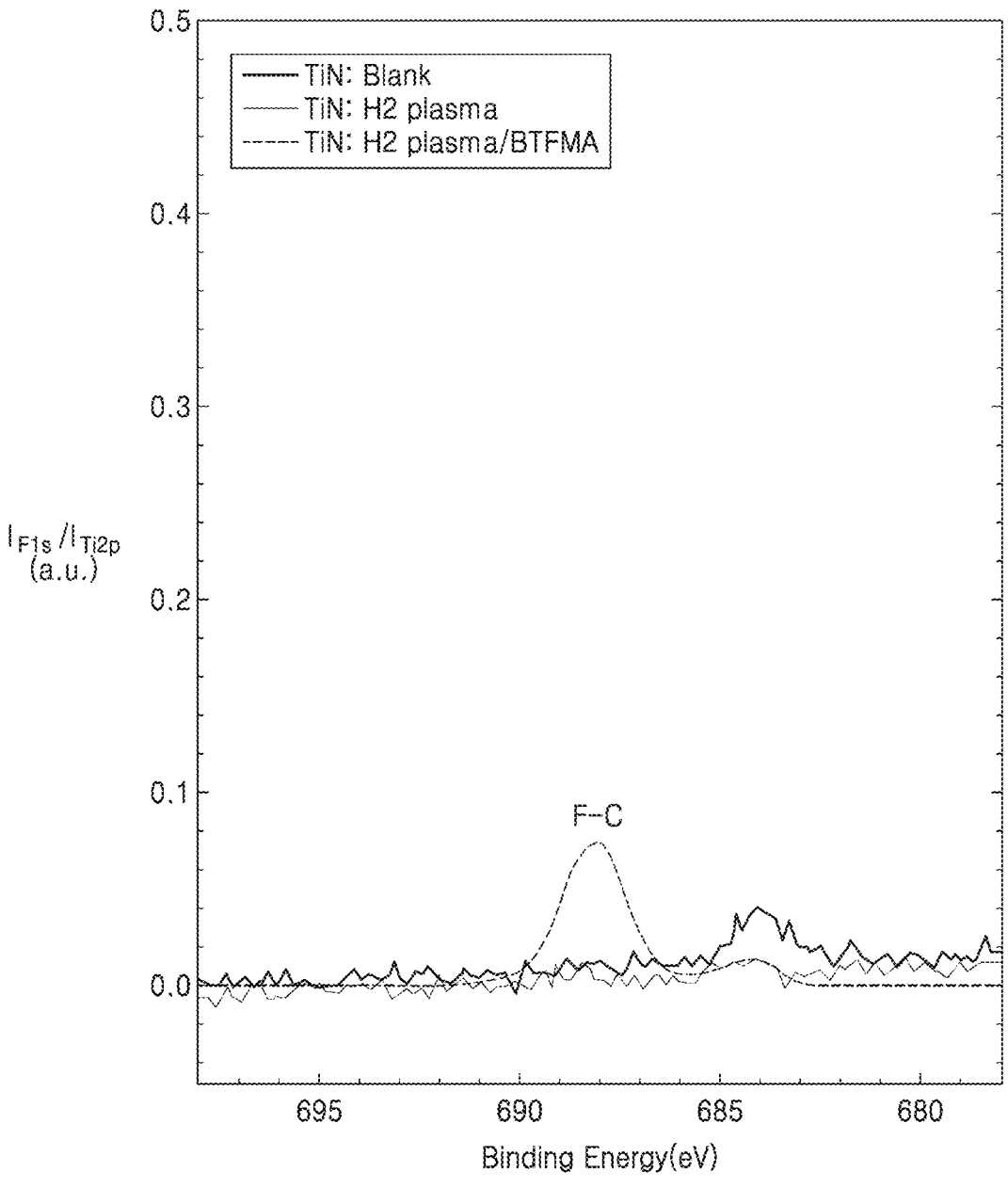
FIGS. 25 and 26A to 26C are graphs illustrating experimental data of some example embodiments to describe a method of manufacturing a semiconductor device according to some example embodiments.

Referring to FIG. 25, it may be seen that the F-C peak is observed even when BTFMA is used as the inhibitor layer. That is, it may be seen that BTFMA is deposited on the TiN surface.

Figure 26A:
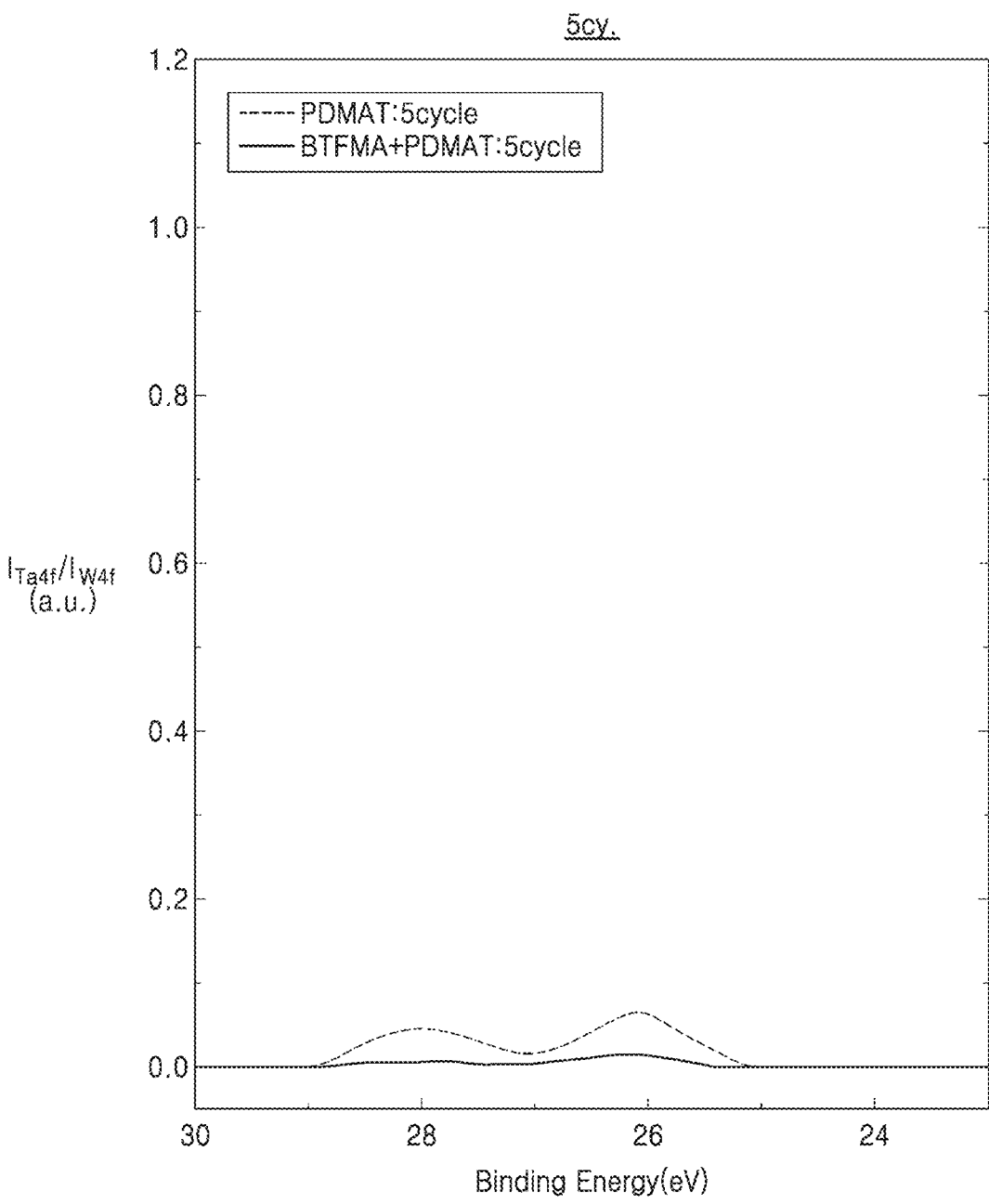
Figure 26B:
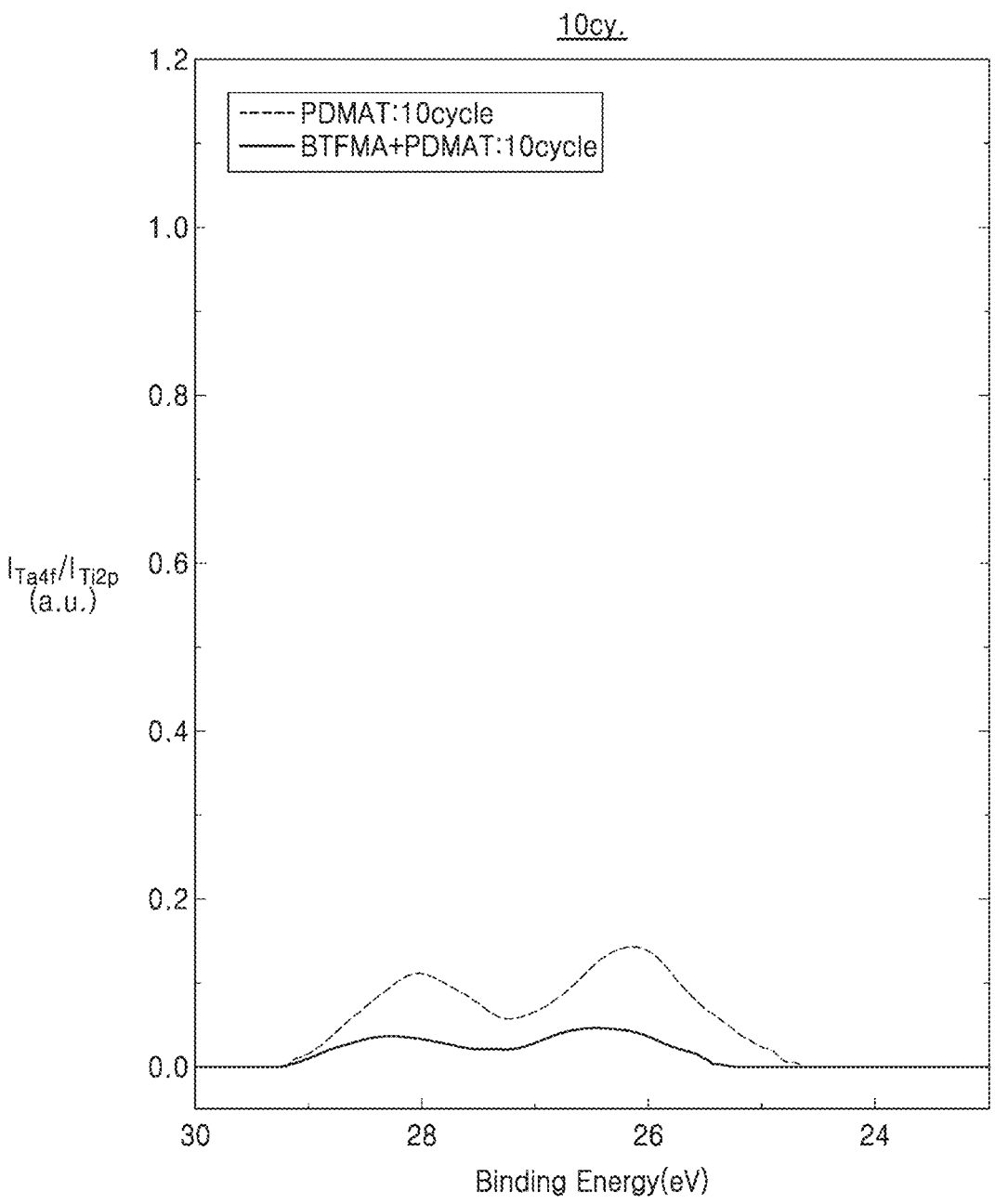
Figure 26C:
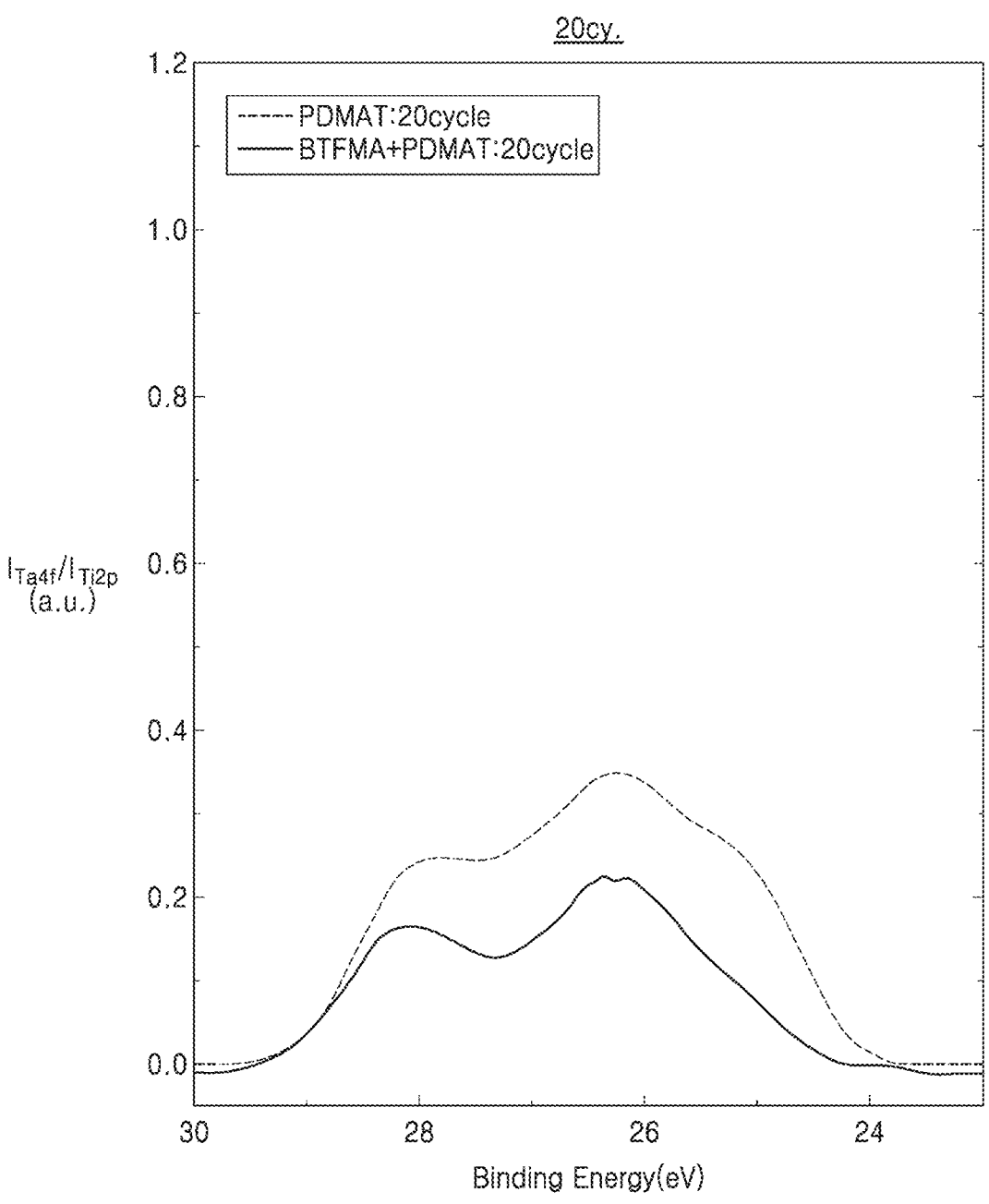

Referring to FIGS. 26A to 26C, it may be observed that the binding of the subsequent interest layer (PDMAT) is reduced when BTFMA is present.

That is, through experimental results of FIGS. 25 and 26A to 26C, it may be seen that BTFMA strongly is bound to the TiN surface and has the ability to inhibit the formation of the subsequent interest layer.

In some example embodiments, the subsequent interest layer may be deposited on a wafer that has undergone a pretreatment process and a process of depositing the inhibitor layer. Specifically, the subsequent interest layer may include tantalum nitride, aluminum oxide, hafnium oxide, niobium oxide, and silicon oxide. In some example embodiments, experiments were performed to measure the performance of the inhibitor layer according to types of layers of interest in first to fourth experimental examples.

In a first experimental example, PDMAT was used as a precursor to deposit tantalum nitride (TaN) as the subsequent interest layer. It was observed that the ratio of the degree of deposition of the interest layer is about 25 or more according to whether the inhibitor layer is present.

In a 2-1th experimental example, a first aluminum precursor of a small size was used as a precursor to deposit aluminum oxide as the subsequent interest layer. For example, the first aluminum precursor may have a diameter equal to or less than 5 Å in the case of a monomer, and equal to or less than 4.5 Å in a short part and 7.5 Å in a long part in the case of a dimer. It was observed that the ratio of the degree of deposition of the interest layer is about 1.5 or more according to whether the inhibitor layer is present.

In a 2-2th experimental example, a second aluminum precursor of a medium size was used as a precursor to deposit aluminum oxide as the subsequent interest layer. For example, the second aluminum precursor may have a diameter equal to or less than 7 Å in the case of a monomer, and equal to or less than 7 Å in a short part and 9 Å in a long part in the case of a dimer. It was observed that the ratio of the degree of deposition of the interest layer is about 1.5 or more according to whether the inhibitor layer is present.

In a 2-3th experimental example, a third aluminum precursor of a large size was used as a precursor to deposit aluminum oxide as the subsequent interest layer. For example, the third aluminum precursor may have a diameter equal to or less than 7.5 Å in the case of a monomer and equal to or less than 10 Å in the case of a dimer. It was observed that the ratio of the degree of deposition of the interest layer is about 7.7 or more according to whether the inhibitor layer is present.

In a third experimental example, tetrakis(ethylmethylamino)hafnium(IV) (TEMAH) was used as a precursor to deposit hafnium oxide as the subsequent interest layer. It was observed that the ratio of the degree of deposition of the interest layer is about 8.3 or more according to whether the inhibitor layer is present.

In a fourth experimental example, a niobium precursor having the size of a monomer equal to or less than 10 Å was used as a precursor to deposit niobium oxide as the subsequent interest layer. It was observed that the ratio of the degree of deposition of the interest layer is about 3.8 or more according to whether the inhibitor layer is present.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

While the inventive concepts have been particularly shown and described with reference to example embodiments thereof, it will be understood that various changes in form and details may be made therein without departing from the spirit and scope of the following claims.

What is claimed is:

1. A method of manufacturing a semiconductor device, the method comprising:

providing a first layer having a first surface and a second layer having a second surface orthogonal to the first surface in a vertical direction;

forming an inhibitor layer conformally on the first surface and the second surface;

exposing the second surface by selectively removing the inhibitor layer on the second surface among the first surface and the second surface, the exposing of the second surface including selectively removing an edge portion of the inhibitor layer on the first surface, the edge portion contacting the second surface; and forming an interest layer on the second surface having been exposed.

2. The method of claim 1, wherein the inhibitor layer comprises a benzene ring.

3. The method of claim 2, wherein the inhibitor layer comprises at least one of 4-trifluoromethyl benzaldehyde (4-TFBA), 3,5-bis (trifluoromethyl) aniline), benzaldehyde, 4-trifluoromethyl aniline, aniline, benzene, 3-trifluorom-ethyl benzaldehyde, 4-trifluoromethyl acetophenone, 3,5-bis (trifluoromethyl) acetophenone, 3-trifluoromethyl acetophe-none, 3-trifluoromethyl benzonitrile, 4-fluorotoluene, 3-fluorophenylacetylene, 4-trifluoromethyl benzoyl chlo-ride, or 4-methylthio aniline.

4. The method of claim 1, wherein the exposing the second surface comprises exposing an entirety of the second surface.

5. The method of claim 1, wherein the forming the interest layer on the second surface having been exposed comprises forming a second portion contacting the first surface and the second surface.

6. The method of claim 1, wherein the exposing the second surface by selectively removing the inhibitor layer on the second surface among the first surface and the second surface comprises not removing a center portion of the inhibitor layer on the first surface, and the center portion not contacting the second surface.

7. The method of claim 1, wherein the first layer com-prises at least one of titanium nitride or titanium aluminum nitride.

8. The method of claim 1, wherein the second layer is configured to release a material comprising acid or hydrogen cations based on stimulation.

9. The method of claim 1, wherein the inhibitor layer is configured to decompose by a chemical reaction with a material comprising acid or hydrogen cations.

10. The method of claim 1, wherein the interest layer comprises at least one of tantalum nitride, aluminum oxide, hafnium oxide, silicon oxide, or niobium oxide.

11. A method of manufacturing a semiconductor device, the method comprising:

performing a pretreatment process on a first surface of a first layer;

forming an inhibitor layer on the first surface and a second surface of a second layer, the first layer including a metal nitride and the second layer not including a metal nitride, the second layer includes an acid-precursor;

exposing the second surface by selectively removing the inhibitor layer on the second surface among the first surface and the second surface based on a heat treat-ment process releasing acid or hydrogen cations from the acid-precursor; and forming an interest layer on the second surface having been exposed.

12. The method of claim 11, wherein the performing of the pretreatment process on the first surface of the first layer comprises at least one of treating the first surface with an HF aqueous solution, treating the first surface with $H_2$ plasma, or treating the first surface with $NH_3$ plasma.

13. The method of claim 11, wherein the inhibitor layer comprises a benzene ring.

14. The method of claim 13, wherein the inhibitor layer comprises at least one of 4-trifluoromethyl benzaldehyde (4-TFBA), 3,5-bis (trifluoromethyl) aniline), benzaldehyde, 4-trifluoromethyl aniline, aniline, benzene, 3-trifluorom-ethyl benzaldehyde, 4-trifluoromethyl acetophenone, 3,5-bis (trifluoromethyl) acetophenone, 3-trifluoromethyl acetophe-none, 3-trifluoromethyl benzonitrile, 4-fluorotoluene, 3-fluorophenylacetylene, 4-trifluoromethyl benzoyl chlo-ride, or 4-methylthio aniline.

15. The method of claim 11, wherein the exposing the second surface comprises selectively removing a first portion of the inhibitor layer on the first surface, and the first portion contacts the first surface and the second surface.

16. The method of claim 11, wherein the forming the interest layer on the second surface having been exposed comprises forming a second portion contacting the first surface and the second surface.

17. The method of claim 11, further comprising:

after forming the interest layer on the second surface having been exposed, removing the inhibitor layer on the first surface.

18. A method of manufacturing a semiconductor device, the method comprising:

pretreating a first surface of a metal nitride layer with $H_2$ plasma;

forming a first inhibitor layer on the first surface;

forming a second inhibitor layer on a second surface of a gap-fill insulating layer orthogonal to the first surface in a vertical direction;

exposing the second surface and a first portion of the first surface by selectively removing the second inhibitor layer from among the first inhibitor layer and the second inhibitor layer through a heat treatment process; and forming an interest layer on the second surface and the first portion of the first surface, and wherein the first portion of the first surface comprises a portion, on which a portion of the second inhibitor layer contacting the first surface and the second surface is formed.

19. The method of claim 18, wherein the gap-fill insulating layer is configured to release a material comprising acid or hydrogen cations based on the heat treatment process, and the second inhibitor layer is configured to decompose by the material comprising the acid or the hydrogen cat-ions.

20. The method of claim 18, further comprising:

after forming the interest layer on the second surface and on the first portion of the first surface, exposing a second portion of the first surface by removing the first inhibitor layer through a wet etching process; and etching the metal nitride layer of the second portion, wherein the second portion comprises a region of the first surface excluding the first portion.

* * * * *